United States Patent
Takeuchi

(10) Patent No.: US 11,289,246 B2
(45) Date of Patent: Mar. 29, 2022

(54) VIBRATOR DEVICE, ELECTRONIC APPARATUS, AND VEHICLE

(71) Applicant: Seiko Epson Corporation, Tokyo (JP)

(72) Inventor: Junichi Takeuchi, Chino (JP)

(73) Assignee: Seiko Epson Corporation

( * ) Notice: Subject to any disclaimer, the term of this patent is extended or adjusted under 35 U.S.C. 154(b) by 34 days.

(21) Appl. No.: 16/881,082

(22) Filed: May 22, 2020

(65) Prior Publication Data

US 2020/0373043 A1    Nov. 26, 2020

(30) Foreign Application Priority Data

May 23, 2019   (JP) .............................. JP2019-096738

(51) Int. Cl.
*H01C 7/04*    (2006.01)
*H02N 2/00*   (2006.01)

(52) U.S. Cl.
CPC ............. *H01C 7/041* (2013.01); *H02N 2/001* (2013.01)

(58) Field of Classification Search
CPC ..................................................... H01C 7/041
See application file for complete search history.

(56) References Cited

U.S. PATENT DOCUMENTS

| 7,471,162 B2* | 12/2008 | Ishikawa | H03L 1/023 |
| | | | 331/108 D |
| 7,759,844 B2* | 7/2010 | Miyahara | H03H 9/0542 |
| | | | 310/348 |
| 2007/0126316 A1* | 6/2007 | Usuda | H03H 9/1021 |
| | | | 310/348 |
| 2010/0123522 A1* | 5/2010 | Kasahara | H03L 1/023 |
| | | | 331/69 |
| 2012/0229225 A1 | 9/2012 | Horie | |
| 2013/0321101 A1 | 12/2013 | Burgess et al. | |
| 2015/0170805 A1 | 6/2015 | Ito et al. | |
| 2017/0230003 A1* | 8/2017 | Kikuchi | H03H 9/10 |
| 2019/0103836 A1* | 4/2019 | Kitada | H03B 5/04 |

FOREIGN PATENT DOCUMENTS

| JP | H09-93077 A | 4/1997 |
| JP | 2012-191484 A | 10/2012 |
| JP | 2016-152478 A | 8/2016 |
| JP | 6419069 B2 | 11/2018 |
| WO | 2014-010591 A1 | 1/2014 |

OTHER PUBLICATIONS

Seiko Epson Corp., "FA-20HS Brief Sheet", Feb. 4, 2019, 2 pages.

* cited by examiner

*Primary Examiner* — Kyung S Lee
(74) *Attorney, Agent, or Firm* — Harness, Dickey & Pierce, P.L.C.

(57) ABSTRACT

A vibrator device includes an intermediate substrate that includes a frame having a first surface and a second surface opposite to the first surface and a vibration element and is formed of quartz crystal, a first substrate that is bonded to the first surface of the frame and is formed of the quartz crystal or glass, a second substrate that is bonded to the second surface of the frame and is formed of the quartz crystal or the glass, and a functional element that is disposed on the first substrate and includes a functional layer, in which the functional element includes a portion overlapping the vibration element in plan view.

7 Claims, 22 Drawing Sheets

VIBRATOR DEVICE, ELECTRONIC APPARATUS, AND VEHICLE

The present application is based on, and claims priority from, JP Application Serial Number 2019-096738, filed May 23, 2019, the disclosure of which is hereby incorporated by reference herein in its entirety.

BACKGROUND

1. Technical Field

The present disclosure relates to a vibrator device, an electronic apparatus, and a vehicle.

2. Related Art

For example, JP-A-2012-191484 discloses a vibrator device including an insulating substrate having a first concave portion opened in an upper surface and a second concave portion opened in a lower surface, a vibration element disposed on a bottom surface of the first concave portion, and a circuit element disposed on a bottom surface of the second concave portion.

The vibrator device having such a configuration needs the second concave portion for disposing the circuit element in addition to the first concave portion for disposing the vibration element and is less likely to be reduced in size.

SUMMARY

A vibrator device according to an application example includes an intermediate substrate that includes a frame having a first surface and a second surface opposite to the first surface and a vibration element and that is formed of quartz crystal, a first substrate that is bonded to the first surface of the frame and is formed of quartz crystal or glass, a second substrate that is bonded to the second surface of the frame and is formed of quartz crystal or glass, and a functional element that is disposed on the first substrate and includes a functional layer, in which the functional element overlaps the vibration element in plan view from a thickness direction of the first substrate.

An electronic apparatus according to an application example includes the vibrator device described above, an oscillation circuit that oscillates the vibration element, an A/D converter that converts an analog signal output from the functional element into a digital signal, and a calculation circuit that receives the digital signal.

A vehicle according to an application example includes the vibrator device described above, an oscillation circuit that oscillates the vibration element, an A/D converter that converts an analog signal output from the functional element into a digital signal, and a calculation circuit that receives the digital signal.

DESCRIPTION OF EXEMPLARY EMBODIMENTS

Hereinafter, a vibrator device, an electronic apparatus, and a vehicle according to embodiments of the present disclosure will be described in detail with reference to the accompanying drawings.

First Embodiment

Figure 1:
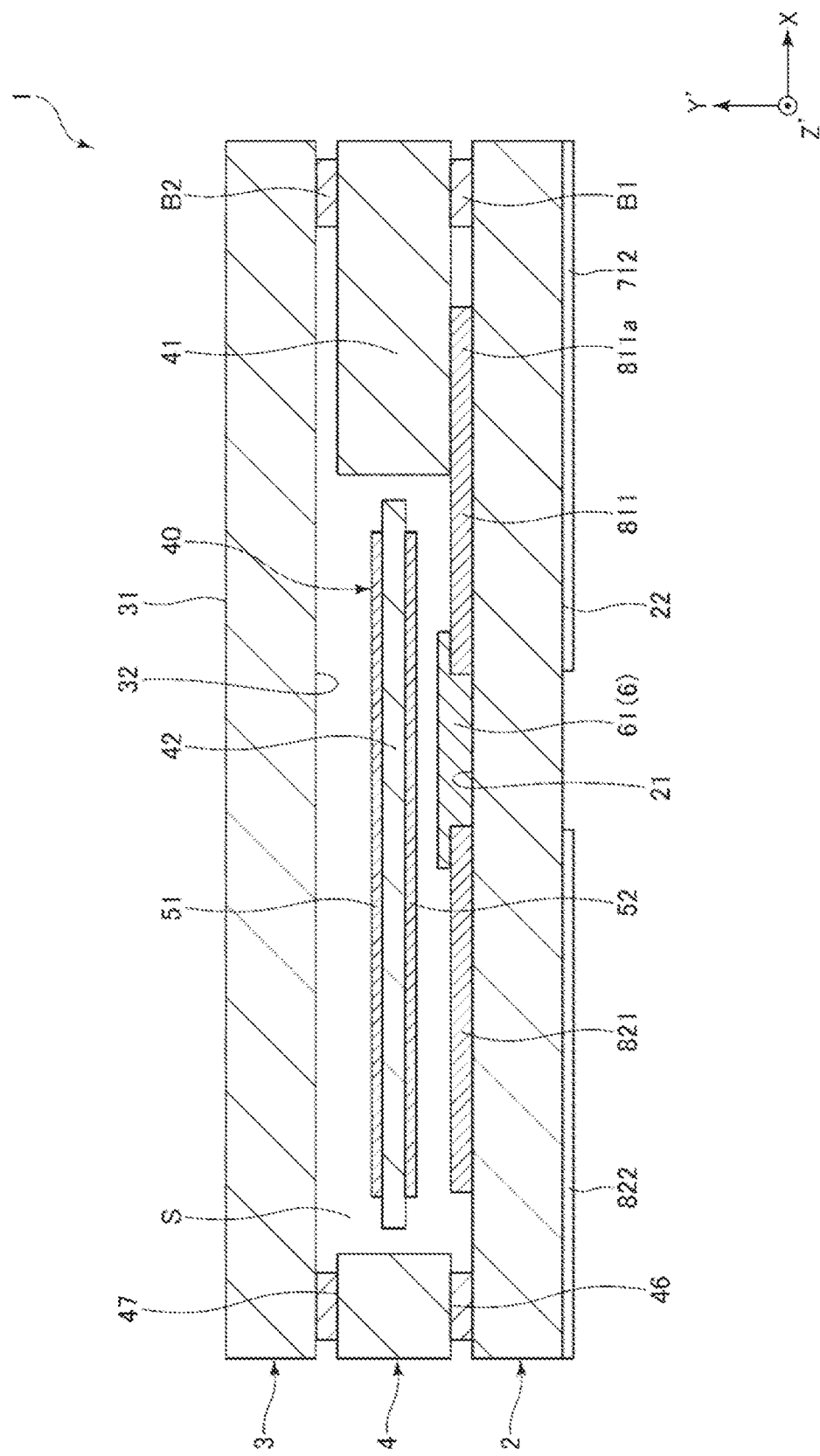
FIG. 1 is a cross-sectional view illustrating a vibrator device according to a first embodiment.
Figure 2:
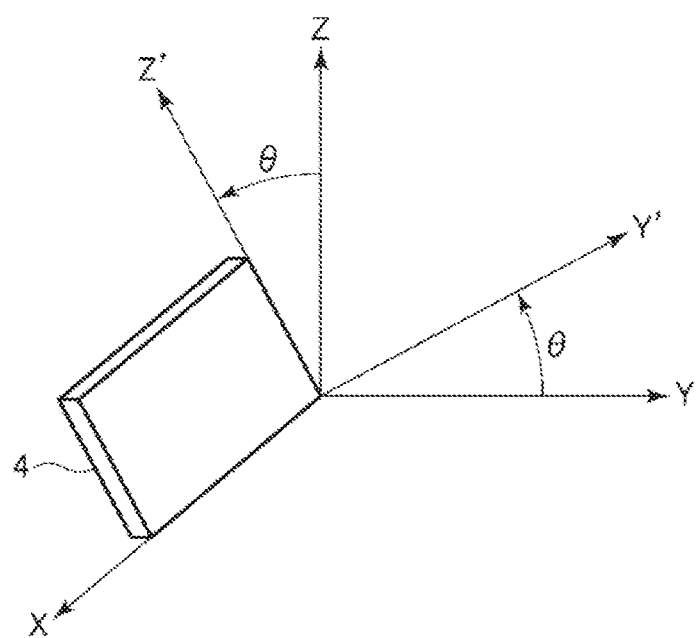
FIG. 2 is a diagram illustrating a cut angle of quartz crystal.
Figure 4:
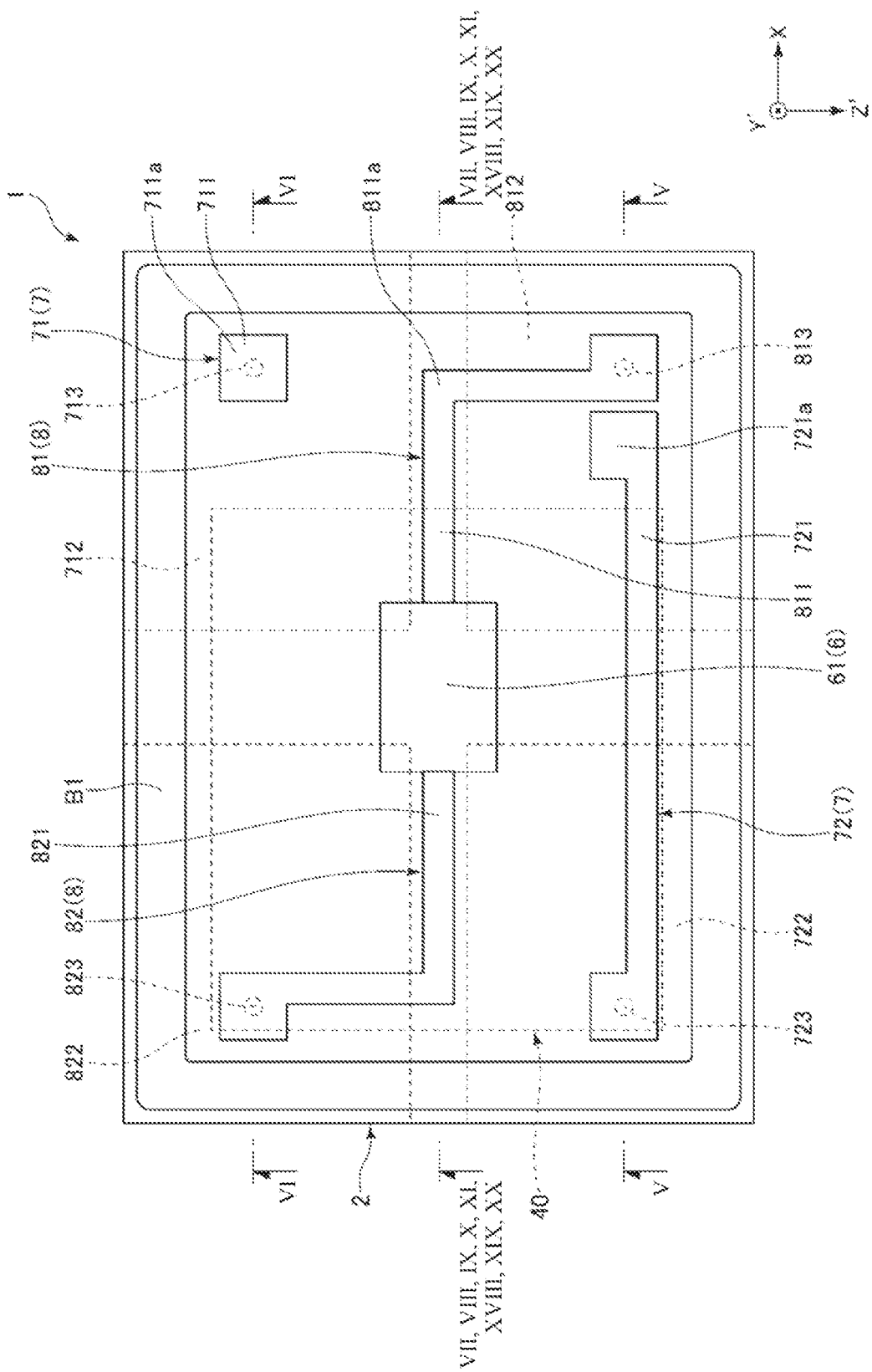
FIG. 4 is a plan view illustrating a first substrate included in the vibrator device of FIG. 1.
Figure 5:
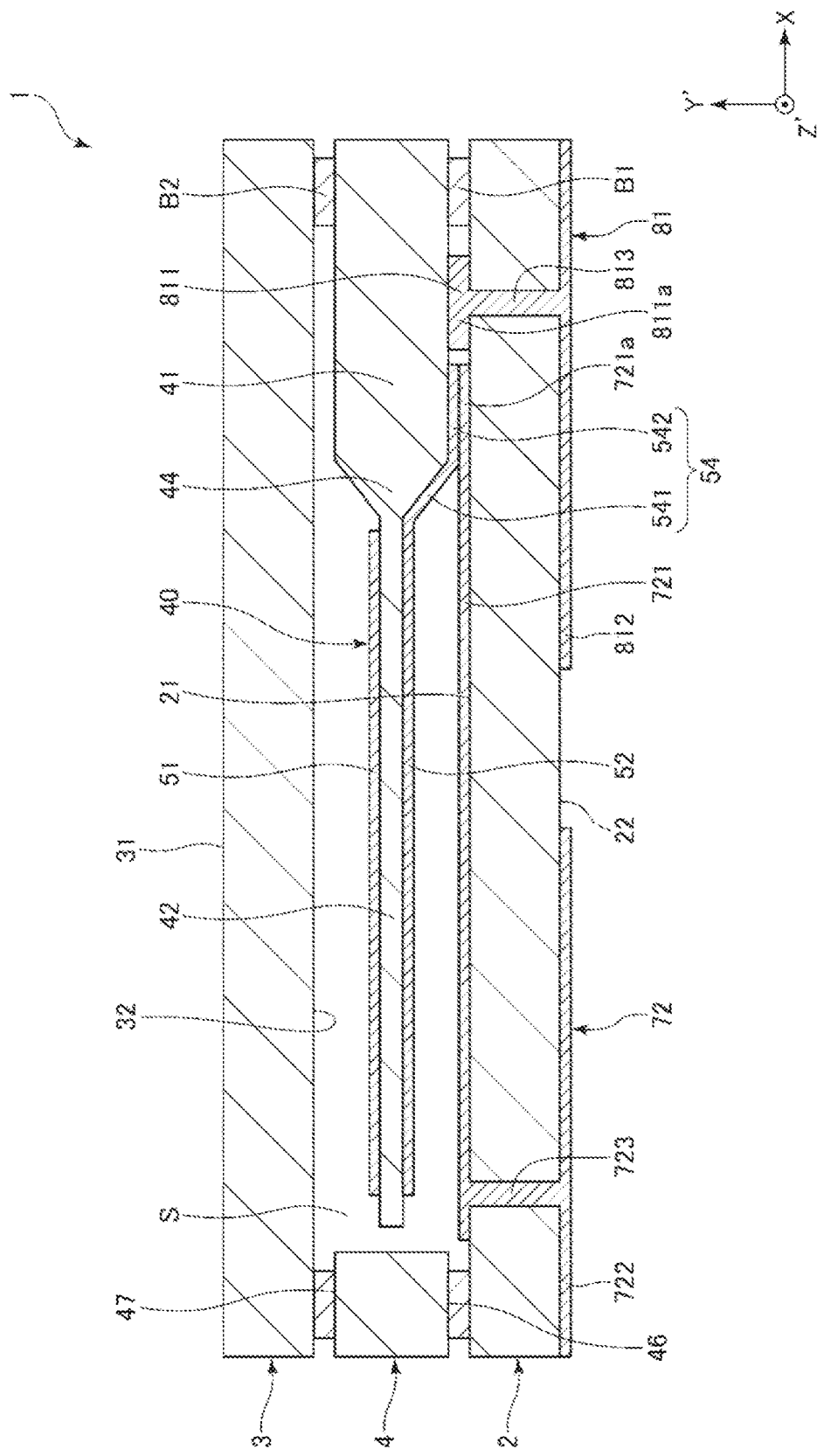
FIG. 5 is a cross-sectional view taken along line V-V of FIG. 4.
Figure 6:
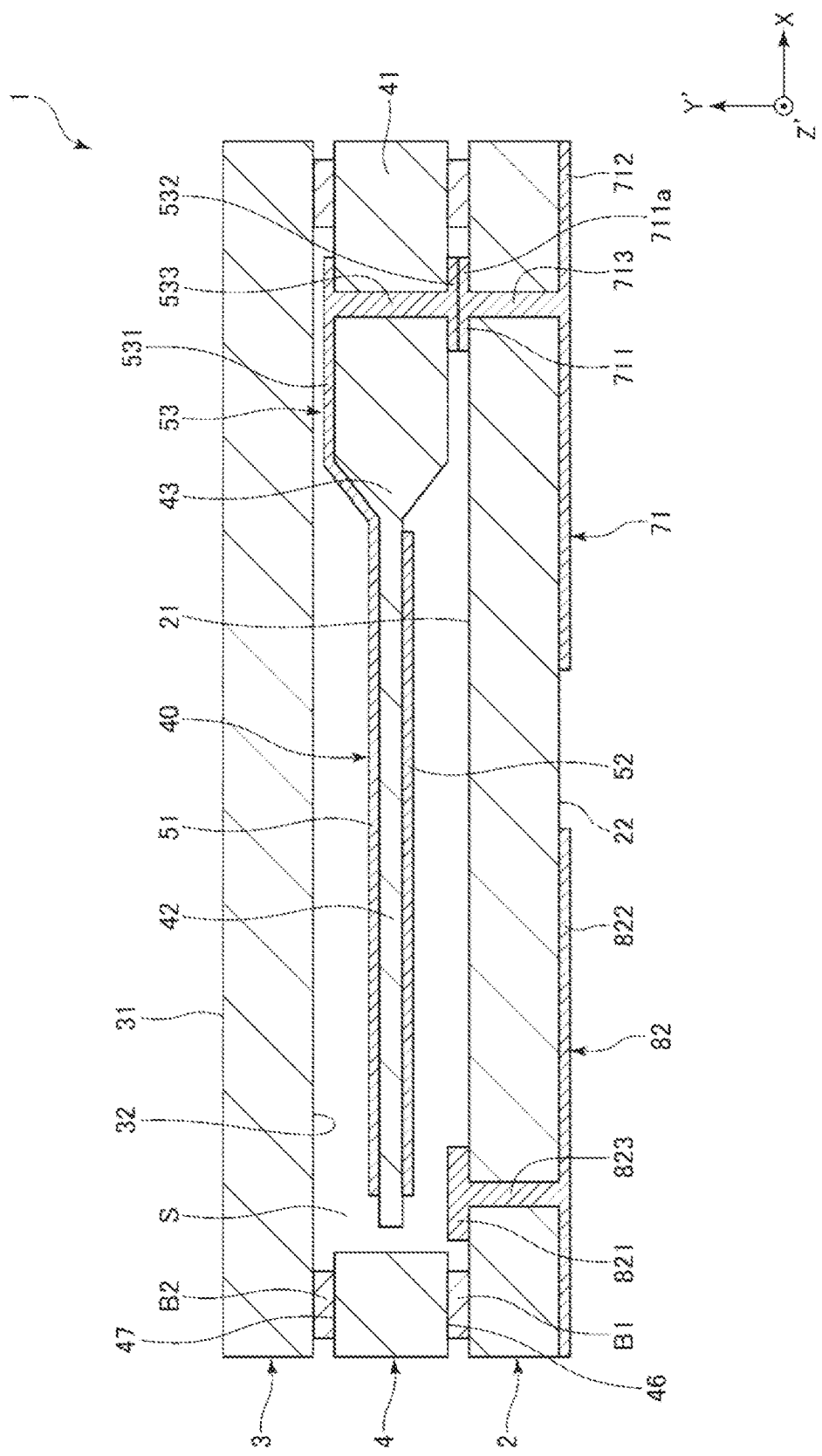
FIG. 6 is a cross-sectional view taken along line VI-VI of FIG. 4.
Figure 7:
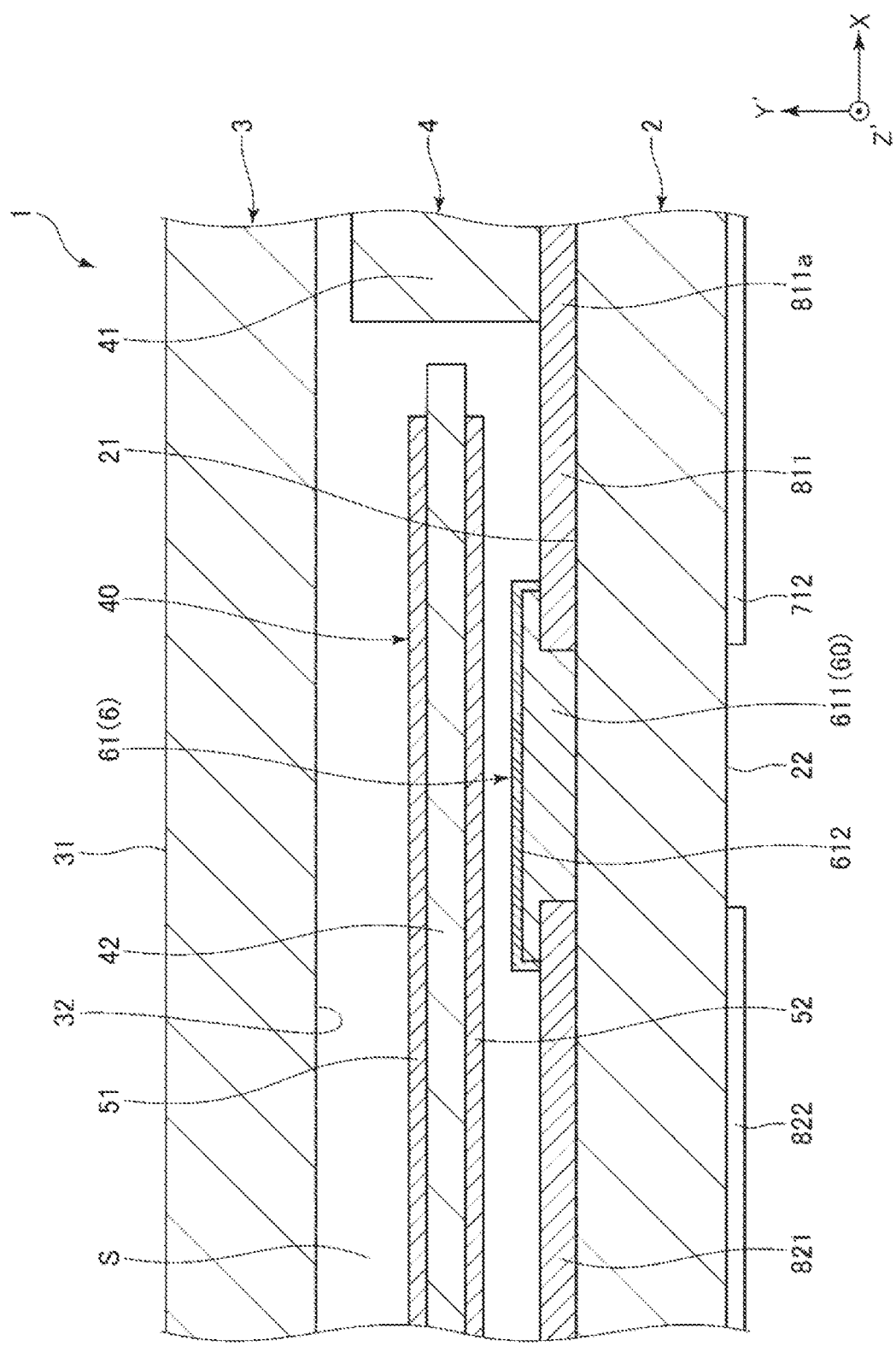
FIG. 7 is a cross-sectional view taken along line VII-VII of FIG. 4.

FIG. 1 is a cross-sectional view illustrating a vibrator device according to a first embodiment. FIG. 2 is a diagram illustrating a cut angle of quartz crystal. FIG. is a plan view illustrating an intermediate substrate included in the vibrator device of FIG. 1. FIG. 4 is a plan view illustrating a first substrate included in the vibrator device of FIG. 1. FIG. 5 is a cross-sectional view taken along line V-V of FIG. 4. FIG. 6 is a cross-sectional view taken along line VI-VI of FIG. 4. FIG. 7 is a cross-sectional view taken along line VII-VII of FIG. 4. For the sake of convenient description, each drawing illustrates three axes orthogonal to each other as an X axis, a Y' axis, and a Z' axis. The X axis, the Y' axis, and the Z' axis indicate crystal axes of quartz crystal as will be described below. Further, a front end side of an arrow on the Y' axis, that is, a positive side is also referred to as an "upper portion", and a base end side, that is, a negative side is also referred to as a "lower portion". Further, a plan view along a thickness direction of q first substrate 2, that is, the Y' axis, is also simply referred to as a "plan view".

A vibrator device 1 illustrated in FIG. 1 includes an intermediate substrate 4, a first substrate 2 located on the negative side of the Y' axis of an intermediate substrate 4 and bonded to a lower surface of the intermediate substrate 4 on the negative side of the Y' axis via a first bonding member B1, a second substrate 3 located on a positive side of the Y' axis of the intermediate substrate 4 and bonded to an upper surface of the positive side of the Y' axis of the intermediate substrate 4 via a second bonding member B2, and a functional element 6 disposed on first substrate 2.

The intermediate substrate 4 is formed of quartz crystal. Particularly, the intermediate substrate 4 of the present embodiment is formed of an AT cut quartz crystal substrate. Briefly, in an AT cut element substrate, the intermediate substrate 4 includes crystal axes X, Y, and Z orthogonal to each other. The X, Y, and Z axes are referred to as an electrical axis, a mechanical axis, and an optical axis, respectively. As illustrated in FIG. 2, the intermediate substrate 4 is a "rotated Y cut quartz crystal substrate" cut along a plane obtained by rotating an X-Z plane around the X axis by a predetermined angle θ, and a substrate cut along a plane rotated by θ=35°15' is referred to as an "AT cut quartz crystal substrate". Hereinafter, the Y axis and the Z axis rotated around the X axis corresponding to an angle θ are referred to as Y' axis and Z' axis. That is, the intermediate substrate 4 has a thickness along the Y' axis and has a spread along an X-Z' plane.

Figure 3:
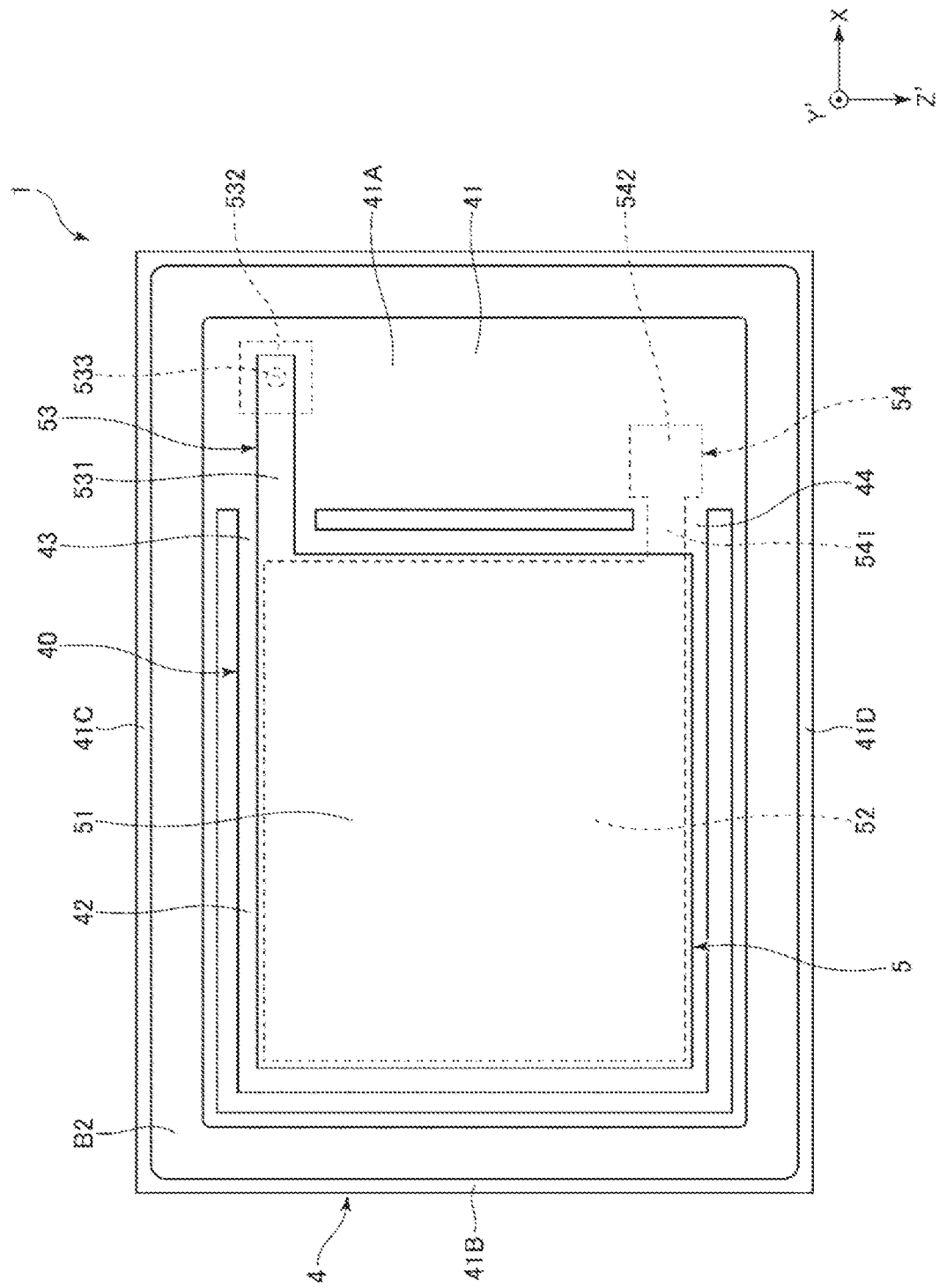
FIG. 3 is a plan view illustrating an intermediate substrate included in the vibrator device of FIG. 1.

As illustrated in FIG. 3, the intermediate substrate 4 includes a frame 41 having a frame shape, a vibrator 42 provided inside the frame 41, and a pair of connectors 43 and 44 connecting the frame 41 and the vibrator 42. The frame 41 includes a first surface on the positive side of the Y' axis and a second surface on the negative side of the Y' axis. The first surface is a lower surface 46 of the frame 41, and the second surface is an upper surface 47 of the frame 41. The frame 41 has a rectangular shape in plan view and includes extenders 41A and 41B extending in the Z' axis and extenders 41C and 41D extending in the X axis. The four extenders 41A to 41D surround a periphery of the vibrator 42. Among the extenders, one extender 41A and the vibrator 42 are coupled via the connectors 43 and 44. As illustrated in FIG. 1, the vibrator 42 has a smaller thickness along the Y' axis than the frame 41, an upper surface thereof is located on the negative side of the Y' axis more than an upper surface 47 of the frame 41, and a lower surface thereof is located on the positive side of the Y' axis more than a lower surface 46 of the frame 41. Thereby, contact between the vibrator and the first and second substrates 2 and 3 can be suppressed.

As illustrated in FIG. 3, an electrode 5 is disposed on the intermediate substrate 4. The electrode 5 includes a first excitation electrode 51 disposed on an upper surface of the vibrator 42 and a second excitation electrode 52 disposed on a lower surface of the vibrator 42. The vibrator 42 is disposed between the first excitation electrode 51 and the second excitation electrode 52. A vibration element 40 is configured by the vibrator 42 and the first and second excitation electrodes 51 and 52. The vibration element 40 has a thickness-shear vibration mode and has third-order frequency temperature characteristics. Accordingly, the vibration element 40 has excellent temperature characteristics.

The configuration of the vibration element 40 is not limited in particular, and, for example, a vibration region, which is a portion interposed between the first and second excitation electrodes 51 and 52 of the vibrator 42 may be a mesa type protruding from a periphery thereof or may be an inverted mesa type which is recessed. Bevel processing for grinding and chamfering the periphery of the vibrator 42, or convex processing for forming convex curved surfaces of the upper and lower surfaces may be performed. The mesa type may be configured to protrude only on one of a lower surface side and an upper surface side, and the inverted mesa type may be configured to be recessed only on one of the lower surface side and the upper surface side. The intermediate substrate 4 is not limited to the AT cut quartz crystal substrate and may be a quartz crystal substrate having another cut angle, for example, Z cut, SC cut, ST cut, BT cut, or the like, and a shape of the vibrator or a configuration of the electrode 5 can be appropriately changed depending on the type of the quartz crystal substrate.

As illustrated in FIG. 3, the electrode 5 includes a first extraction electrode 53 that extracts the first excitation electrode 51 to the extender 41A of the frame 41 via the connector 43, and a second extraction electrode 54 that extracts the second excitation electrode 52 to the extender 41A of the frame 41 via the connector 44.

The first extraction electrode 53 includes a wire 531 that extends from the first excitation electrode 51 through the connector 43 to the upper surface of the extender 41A, a coupling terminal 532 disposed on a lower surface of the extender 41A, and a through-electrode 533 passing through the extender 41A and electrically coupling the wire 531 to the coupling terminal 532. Meanwhile, the second extraction electrode 54 includes a wire 541 extending from the second excitation electrode 52 to a lower surface of the extender 41A through the connector 44, and a coupling terminal 542 disposed on a lower surface of the extender 41A and electrically coupled to the wire 541.

Configuration materials of the first and second extraction electrodes 53 and 54 are not limited in particular, and metal materials such as, gold (Au), silver (Ag), platinum (Pt), palladium (Pd), iridium (Ir), copper (Cu), aluminum (Al), nickel (Ni), chromium (Cr), Ti (titanium), and tungsten (W), and alloys containing the metal materials can be used therefor.

The first substrate 2 is located on the negative side of the Y' axis of the intermediate substrate 4 described above, and the second substrate 3 is located on the positive side of the Y' axis. The first substrate 2 includes an upper surface 21 which is a third surface, and a lower surface 22 which is a fourth surface. Likewise, the second substrate 3 also includes an upper surface 31 and a lower surface 32. As illustrated in FIG. 1, the lower surface 22, the upper surface 21, the lower surface 46, the upper surface 47, the lower surface 32, and the upper surface 31 face an upward direction which is the positive direction of the Y' axis and are placed in this order and substantially in parallel.

In the arrangement, the upper surface 21 of the first substrate 2 and the lower surface 46 of the frame 41 are bonded together via a first bonding member B1, and the lower surface 32 of the second substrate 3 and the upper surface 47 of the frame 41 are bonded together via a second bonding member B2. Thereby, the first substrate 2, the second substrate 3, and the frame 41 form an airtight internal space S for housing the vibration element 40. The internal space S is in a reduced pressure state, preferably in a state closer to vacuum. Thereby, vibration characteristics of the vibration element 40 are improved. However, atmosphere of the internal space S is not limited in particular and may be, for example, atmosphere in which an inert gas such as nitrogen or Ar is sealed, and may be in an atmospheric pressure state or a pressurized state instead of the reduced pressure state.

The first substrate 2 and the second substrate 3 have a plate shape and are formed of a quartz crystal material or a glass material. Particularly, in the present embodiment, the first and second substrates 2 and 3 are formed of quartz crystal. As described above, the first and second substrates 2 and 3 are formed of quartz crystal like the intermediate substrate 4, and the substrates 2, 3, and 4 can have the same thermal expansion coefficient. Accordingly, thermal stress due to a difference in thermal expansion coefficient between the substrates 2, 3, and 4 does not substantially occur, and the vibration element 40 is less likely to receive the stress. Accordingly, it is possible to more effectively suppress deterioration and variation of vibration characteristics of the vibration element 40. When the first substrate 2 and the second substrate 3 are formed of a glass material, the glass material is not limited in particular, and soda lime glass, quartz glass, or the like can be used.

Particularly, the first and second substrates 2 and 3 are formed of a quartz crystal substrate having the same cut angle as the intermediate substrate 4. As described above, since the intermediate substrate 4 is formed from an AT cut quartz crystal substrate, the first and second substrates 2 and 3 are also formed from the AT cut quartz crystal substrate. Further, orientations of the crystal axes of the first and second substrates 2 and 3 match orientations of the crystal axes of the intermediate substrate 4. That is, the first and second substrates 2 and 3 and the intermediate substrate 4 have the same X-axis orientation, the same Y'-axis orientation, and the same Z'-axis orientation. Since quartz crystal has different thermal expansion coefficients along the X axis, the Y axis, and the Z axis, the first and second substrates 2, 3 and the intermediate substrate 4 are set to have the same cut angle, and orientations of the crystal axes are mutually aligned, and thus, the above-described thermal stress is less likely to be generated between the substrates 2, 3, and 4. Accordingly, the vibration element 40 is less likely to receive stress, and deterioration and variation of the vibration characteristics can be suppressed more effectively.

However, configurations of the first and second substrates 2 and 3 are not limited in particular, and at least one of the first and second substrates 2 and 3 may be formed of a quartz crystal substrate having a cut angle different from the cut angle of the intermediate substrate 4, and the cut angles may be the same, but the crystal axes may face different directions from the intermediate substrate 4.

As illustrated in FIGS. 4 to 6, a vibration element wire 7 electrically coupled to the vibration element 40 and a functional element wire 8 electrically coupled to the functional element 6 are disposed on the first substrate 2. The vibration element wire 7 includes a first vibration element wire 71 and a second vibration element wire 72, and the functional element wire 8 includes a first functional element wire 81 and a second functional element wire 82.

As illustrated in FIG. 6, the first vibration element wire 71 includes an internal wire 711 disposed on the upper surface 21 of the first substrate 2, an external terminal 712 disposed on the lower surface 22 of the first substrate 2, and a through-electrode 713 that passes through the upper surface 21 and the lower surface 22 of the first substrate 2 and electrically couples the internal wire 711 to the external terminal 712. Further, the internal wire 711 includes a portion 711a located between the first substrate 2 and the extender 41A of the frame 41, and the portion 711a is in contact with the coupling terminal 532 to be electrically coupled to each other. Thereby, the first vibration element wire 71 is electrically coupled to the first excitation electrode 51.

As illustrated in FIG. 5, the second vibration element wire 72 includes an internal wire 721 disposed on the upper surface 21 of the first substrate 2, an external terminal 722 disposed on the lower surface 22 of the first substrate 2, and a through-electrode 723 that passes through the upper surface 21 and the lower surface 22 of the first substrate 2 and electrically couples the internal wire 721 to the external terminal 722. The internal wire 721 includes a portion 721a located between the first substrate 2 and the extender 41A of the frame 41, and the portion 721a is in contact with the coupling terminal 542 and is electrically coupled. Thereby, the second vibration element wire 72 is electrically coupled to the second excitation electrode 52.

As illustrated in FIG. 5, the first functional element wire 81 includes an internal wire 811 disposed on the upper surface 21 of the first substrate 2, an external terminal 812 disposed on the lower surface 22 of the first substrate 2, and a through-electrode 813 that passes through the upper surface 21 and the lower surface 22 of the first substrate 2 and electrically couples the internal wire 811 to the external terminal 812. The internal wire 811 is located between the first substrate 2 and the extender 41A of the frame 41 and includes a portion 811a in contact with the extender 41A, and the portion 811a is thermally coupled to the frame 41. Thereby, the intermediate substrate 4 is thermally coupled to the functional element 6 via the first functional element wire 81. Further, the through-electrode 813 overlaps the extender 41A in plan view.

The second functional element wire 82 includes an internal wire 821 disposed on the upper surface 21 of the first substrate 2, an external terminal 822 disposed on the lower surface 22 of the first substrate 2, and a through-electrode 823 that passes through the upper surface 21 and the lower surface 22 of the first substrate 2 and electrically couples the internal wire 821 to the external terminal 822.

Configuration materials of the first and second vibration element wires 71 and 72 and the first and second functional element wires 81 and 82 are not limited in particular, and metal materials such as, gold (Au), silver (Ag), platinum (Pt), palladium (Pd), iridium (Ir), copper (Cu), aluminum (Al), nickel (Ni), chromium (Cr), Ti (titanium), and tungsten (W), and alloys containing the metal materials can be used therefor.

As illustrated in FIG. 7, the functional element 6 is disposed on the upper surface 21 of the first substrate 2. The functional element 6 is located in the internal space S. The functional element 6 according to the present embodiment is a thermistor element 61 functioning as a temperature sensor that detects a temperature of the vibration element 40. As such, by disposing the thermistor element 61 on the upper surface 21 of the first substrate 2, the thermistor element 61 can be brought close to the vibration element 40, and a temperature difference between the thermistor element 61 and the vibration element 40 is less likely to be generated. Accordingly, a temperature of the vibration element 40 can be detected more accurately by the thermistor element 61.

Particularly, the thermistor element 61 is disposed on the upper surface 21 of the first substrate 2. By disposing the thermistor element 61 on the upper surface 21 of the first substrate 2, the thermistor element 61 can be disposed in the same internal space S as the vibration element 40. Further, the thermistor element 61 and the vibration element 40 can be disposed closer to each other. Accordingly, a temperature of the vibration element 40 can be detected more accurately by the thermistor element 61. Further, the thermistor element 61 can be protected.

As described above, the internal wire 811 electrically coupled to the thermistor element 61 is thermally coupled to the frame 41 via the portion 811a. Accordingly, the vibration element 40 is thermally coupled to the thermistor element 61 via the internal wire 811, and a temperature difference between the thermistor element 61 and the vibration element 40 is less likely to be generated. Accordingly, a temperature of the vibration element 40 can be detected more accurately by the thermistor element 61.

As described above, the through-electrode 813 formed on the first substrate 2 and electrically coupled to the thermistor element 61 overlaps the extender 41A of the frame 41 in plan view. Thereby, a thermal coupling between the frame 41 and the through-electrode 813 improves, and a temperature difference between the thermistor element 61 and the vibration element 40 is less likely to be generated. Accordingly, a temperature of the vibration element 40 can be detected more accurately by the thermistor element 61.

Particularly, since the through-electrode 533 is formed in the frame 41 thermally coupled to the internal wire 811 and the through-electrode 813, a thermal coupling between the frame 41 and the vibration element 40 improves. Accordingly, a temperature difference between the thermistor element 61 and the vibration element 40 is less likely to be generated, and a temperature of the vibration element 40 can be detected more accurately by the thermistor element 61.

Since the internal wires 711, 721, 811, and 821 disposed on the upper surface 21 of the first substrate 2 are located inside the first bonding member B1, that is, in the internal space S, the internal wires are less likely to be affected by a temperature change outside the vibrator device 1. Accordingly, a temperature of the vibration element 40 can be detected more accurately by the thermistor element 61.

Further, the thermistor element 61 includes a portion overlapping the vibration element 40 in plan view. Thereby, the thermistor element 61 and the vibration element 40 can be disposed closer to each other. Accordingly, a temperature of the vibration element 40 can be detected more accurately by the thermistor element 61. Further, a spread of the vibrator device 1 along the X axis and the Z' axis can be suppressed, and a size of the vibrator device 1 can be reduced. Particularly, in the present embodiment, since the whole area of the thermistor element 61 overlaps the vibration element 40, the above-described effect can be more remarkably obtained. However, the present disclosure is not limited to this, and a part of the thermistor element 61 may overlap the vibration element 40, or the whole area may not overlap the vibration element 40.

The thermistor element 61 is a thin film thermistor element and includes a thermistor thin film 611 which is disposed on the upper surface 21 of first substrate 2 and is electrically coupled to internal wires 811 and 821 and serves as a functional layer 60, and a passivation film 612 covering thermistor thin film 611 as illustrated in FIG. 7. As such, by configuring the thermistor element 61 to include the thermistor thin film 611 as the functional layer 60 disposed on the upper surface 21 of the first substrate 2, a thickness of the thermistor element 61 can be reduced.

Further, the thermistor thin film 611 includes a portion disposed on a surface on the positive side of the Y' axis of the internal wires 811 and 821. Accordingly, a contact area between the thermistor thin film 611 and the internal wires 811 and 821 is widened, and heat is more easily transmitted from the vibration element 40 to the thermistor thin film 611 via the frame 41 and the internal wire 811. As a result, a temperature difference between the thermistor element 61 and the vibration element 40 is less likely to be generated.

The thermistor thin film 611 is a composite metal oxide film formed of a composite metal oxide containing at least one of nickel (Ni), iron (Fe), and copper (Cu) in a Mn—Co-based composite metal oxide, and has a spinel-type crystal structure. Meanwhile, the passivation film 612 is formed of, for example, a silicon oxide film ($SiO_2$). However, configuration materials of the thermistor thin film 611 and the passivation film 612 are not limited in particular.

The vibrator device 1 is described above. As described above, the vibrator device 1 includes the vibration element 40, the frame 41, the intermediate substrate 4 formed of quartz crystal, the first substrate 2 which is bonded to the lower surface 46 (first surface) of the frame 41 and formed of quartz crystal or glass, the second substrate 3 which is bonded to the upper surface 47 (second surface) opposite to the lower surface 46 of the frame 41 and formed of quartz crystal or glass, and the thermistor element 61 as the functional element 6 including the thermistor thin film 611 as the functional layer 60 disposed on the first substrate 2. The thermistor element 61 includes a portion that overlaps the vibration element 40 in plan view. Thereby, it is possible to reduce a size of the vibrator device 1, and particularly to reduce a height.

Further, as described above, the thermistor element 61 is disposed on the upper surface 21 (third surface) of the first substrate 2 on the vibration element side. Thereby, the thermistor element 61 can be disposed between the vibration element 40 and the first substrate 2, and the thermistor element 61 can be protected. Further, the thermistor element 61 and the vibration element 40 can be disposed closer to each other. Accordingly, a temperature of the vibration element 40 can be detected more accurately by the thermistor element 61.

Further, as described above, the functional element 6 is the thermistor element 61. Thereby, a temperature of the vibration element 40 can be detected by the thermistor element 61.

Further, as described above, the vibrator device 1 includes the functional element wire 8 which is disposed on the upper surface 21 of the first substrate 2 and is electrically coupled to the thermistor element 61 as the functional element 6. The functional element wire 8 is in contact with the frame 41. Accordingly, the vibration element 40 is thermally coupled to the thermistor element via the functional element wire 8, and a temperature difference between the thermistor element 61 and the vibration element 40 is less likely to be generated. Accordingly, a temperature of the vibration element 40 can be detected more accurately by the thermistor element 61.

Further, as described above, the vibrator device 1 includes the vibration element wire 7 which is disposed on the upper surface 21 of the first substrate 2 and is electrically coupled to the vibration element 40. Portions disposed on the upper surface 21 of the functional element wire 8 and the vibration element wire 7 are each disposed further inside than a bonding portion between the first substrate 2 and the frame 41. Thereby, since the portions disposed on the upper surface 21 of the functional element wire 8 and the vibration element wire 7 can be disposed in the hermetically sealed internal space S, a thermal coupling between the vibration element 40 and the thermistor element 61 is improved. Further, the portions are less likely to be affected by a temperature change outside the vibrator device 1. Accordingly, a temperature of the vibration element 40 can be detected more accurately by the thermistor element 61.

Second Embodiment

Figure 8:
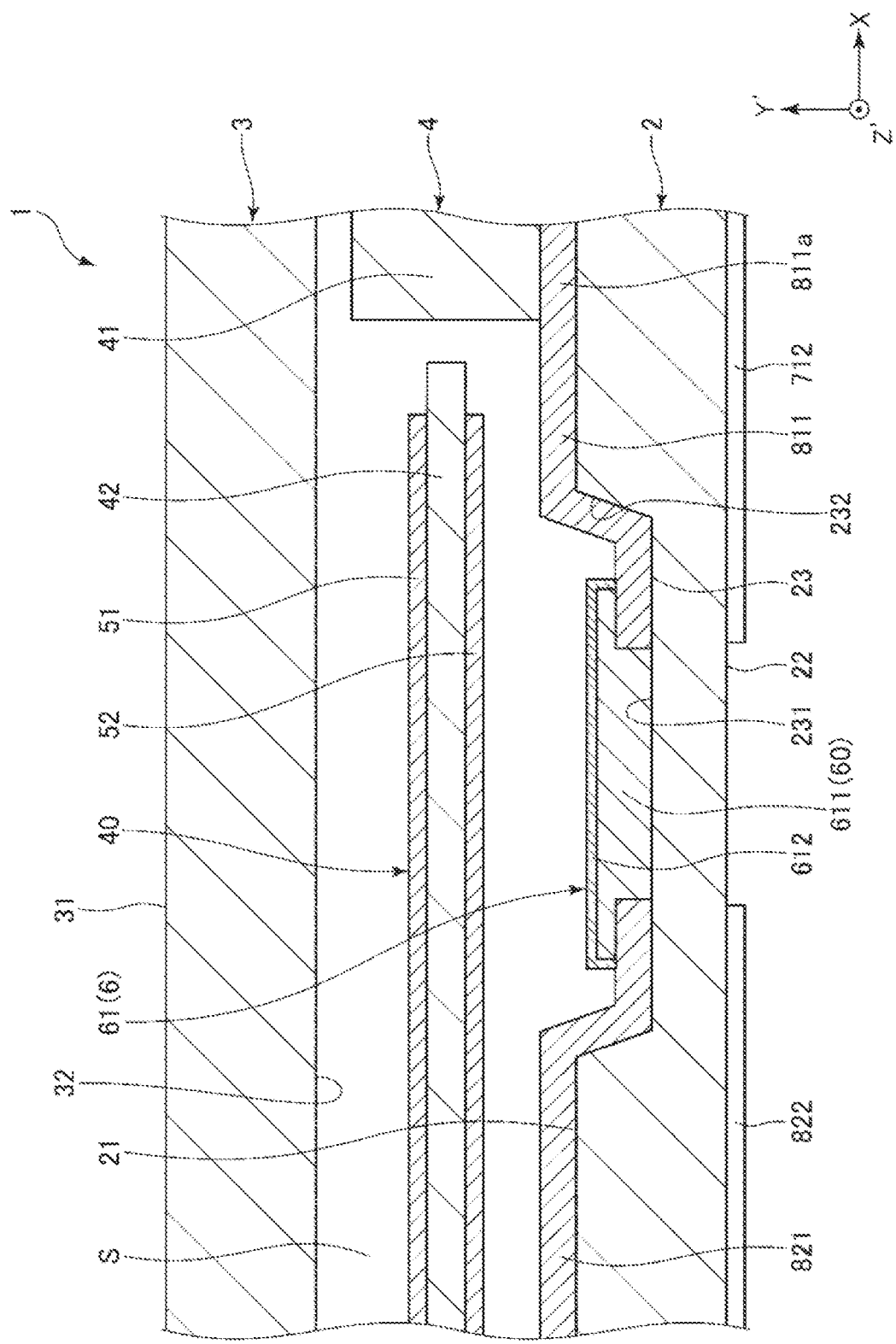
FIG. 8 is a cross-sectional view illustrating a vibrator device according to a second embodiment.

FIG. 8 is a cross-sectional view illustrating a vibrator device according to a second embodiment. FIG. 8 is a cross-sectional view corresponding to a cross section taken along line XIII-VIII in FIG. 4.

The vibrator device 1 according to the present embodiment is the same as the vibrator device 1 according to the above-described first embodiment except that a configuration of the first substrate 2 is different therefrom. In the following description, the vibrator device 1 according to the second embodiment will be described by focusing on a difference from the first embodiment described above, and description on the same item will be omitted. Further, in FIG. 8, the same configuration as in the above-described embodiment will be denoted by the same reference numeral.

As illustrated in FIG. 8, the first substrate 2 includes the concave portion 23 opened in the upper surface 21 thereof. The thermistor element 61 is disposed on a bottom surface 231 of the concave portion 23. Thereby, for example, a height of the vibrator device 1 can be reduced as compared with the first embodiment described above. As a method of forming the concave portion 23 of the first substrate 2, the concave portion 23 can be formed on a wafer formed of a quartz crystal material or a glass material by using, for example, wet etching.

A side surface of the concave portion 23 is an inclined surface 232 that is inclined with respect to a thickness direction of the first substrate 2, that is, the Y' axis, and the bottom surface 231 is gently coupled to the upper surface 21 by the inclined surface 232. Further, each of the internal wires 811 and 821 electrically coupled to the thermistor element 61 is disposed on the bottom surface 231, the inclined surface 232, and the upper surface 21. In other words, the internal wires 811 and 821 extend from the bottom surface 231 to the upper surface 21 through the inclined surface 232. As such, by configuring the side surface of the concave portion 23 as the inclined surface 232, decoupling of the internal wires 811 and 821 passing through the portion can be effectively suppressed.

As described above, in the vibrator device 1 according to the present embodiment, the first substrate 2 includes the concave portion 23 opened in the upper surface 21, and the thermistor element 61 is disposed on the bottom surface 231 of the concave portion 23. Thereby, for example, a height of the vibrator device 1 can be reduced as compared with the first embodiment described above.

Further, as described above, the vibrator device includes the functional element wire 8 electrically coupled to the thermistor element 61. Further, the side surface of the concave portion 23 is the inclined surface 232 that is inclined with respect to the thickness direction of the first substrate 2. The functional element wire 8 is disposed on the bottom surface 231, the inclined surface 232, and the upper surface 21. As such, by configuring the side surface of the concave portion 23 as the inclined surface 232, decoupling of the functional element wire 8 can be effectively suppressed.

According to the above-described second embodiment, the same effect as in the above-described first embodiment can also be obtained.

Third Embodiment

Figure 9:
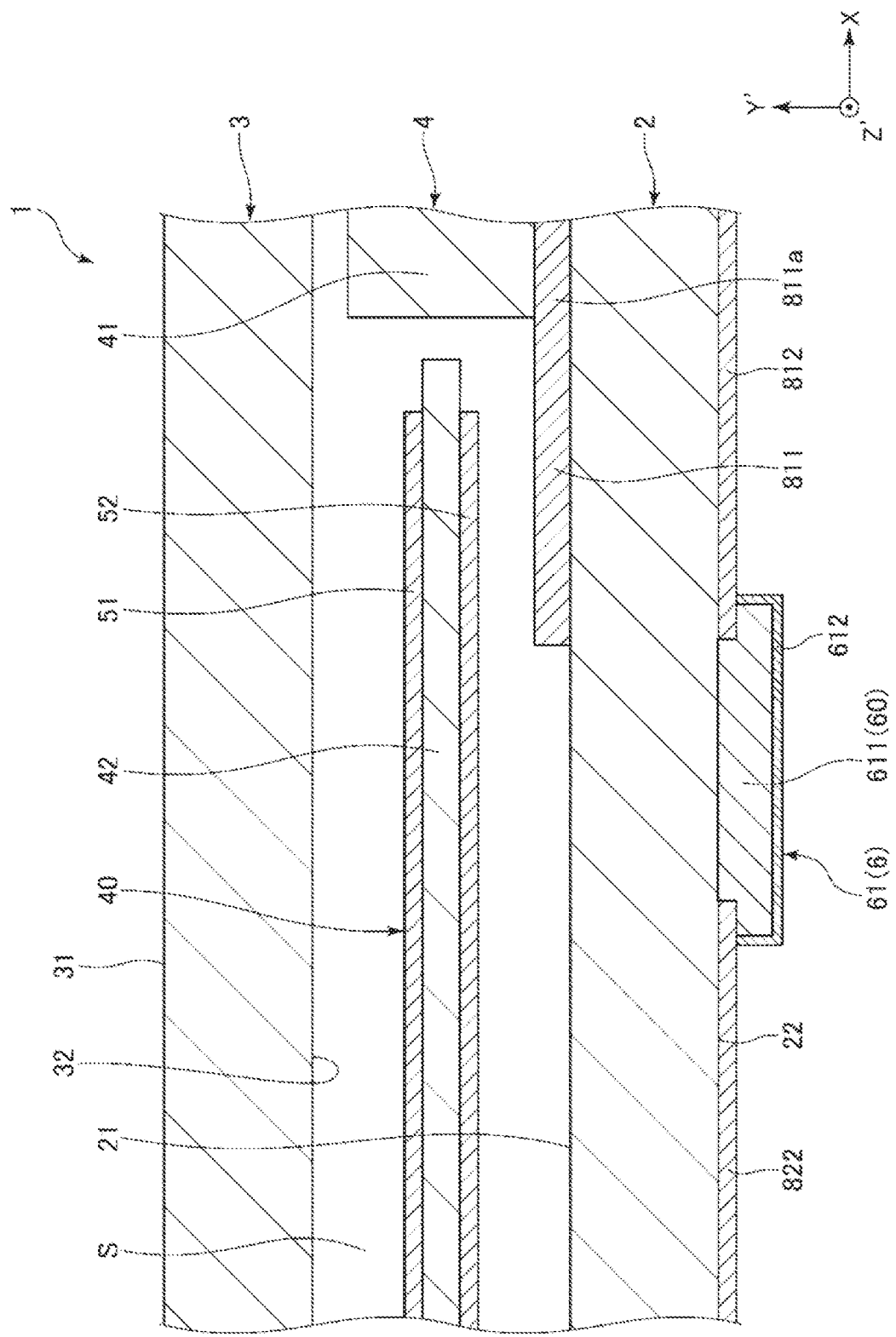
FIG. 9 is a cross-sectional view illustrating a vibrator device according to a third embodiment.

FIG. 9 is a cross-sectional view illustrating a vibrator device according to a third embodiment. FIG. 9 is a cross-sectional view corresponding to a cross section taken along line IX-IX of FIG. 4.

The vibrator device 1 according to the present embodiment is the same as the vibrator device 1 according to the above-described first embodiment except that disposition of the thermistor element 61 is different therefrom. In the following description, the vibrator device 1 according to the third embodiment will be described by focusing on a difference from the first embodiment described above, and description on the same item will be omitted. In FIG. 9, the same configuration as in the above-described embodiment will be denoted by the same reference numeral.

As illustrated in FIG. 9, the thermistor element 61 is disposed on the lower surface 22 (fourth surface) of the first substrate 2 opposite to the upper surface 21. According to the configuration, for example, a disposition space of the thermistor element 61 is widened and formation of the thermistor element 61 is easier than in the first embodiment described above. In the present embodiment, the thermistor element 61 is electrically coupled to the external terminals 812 and 822. Further, the internal wire 821 and the through-electrode 823 are omitted from the second functional element wire 82.

According to the third embodiment described above, the same effect as in the first embodiment can also be obtained.

Fourth Embodiment

Figure 10:
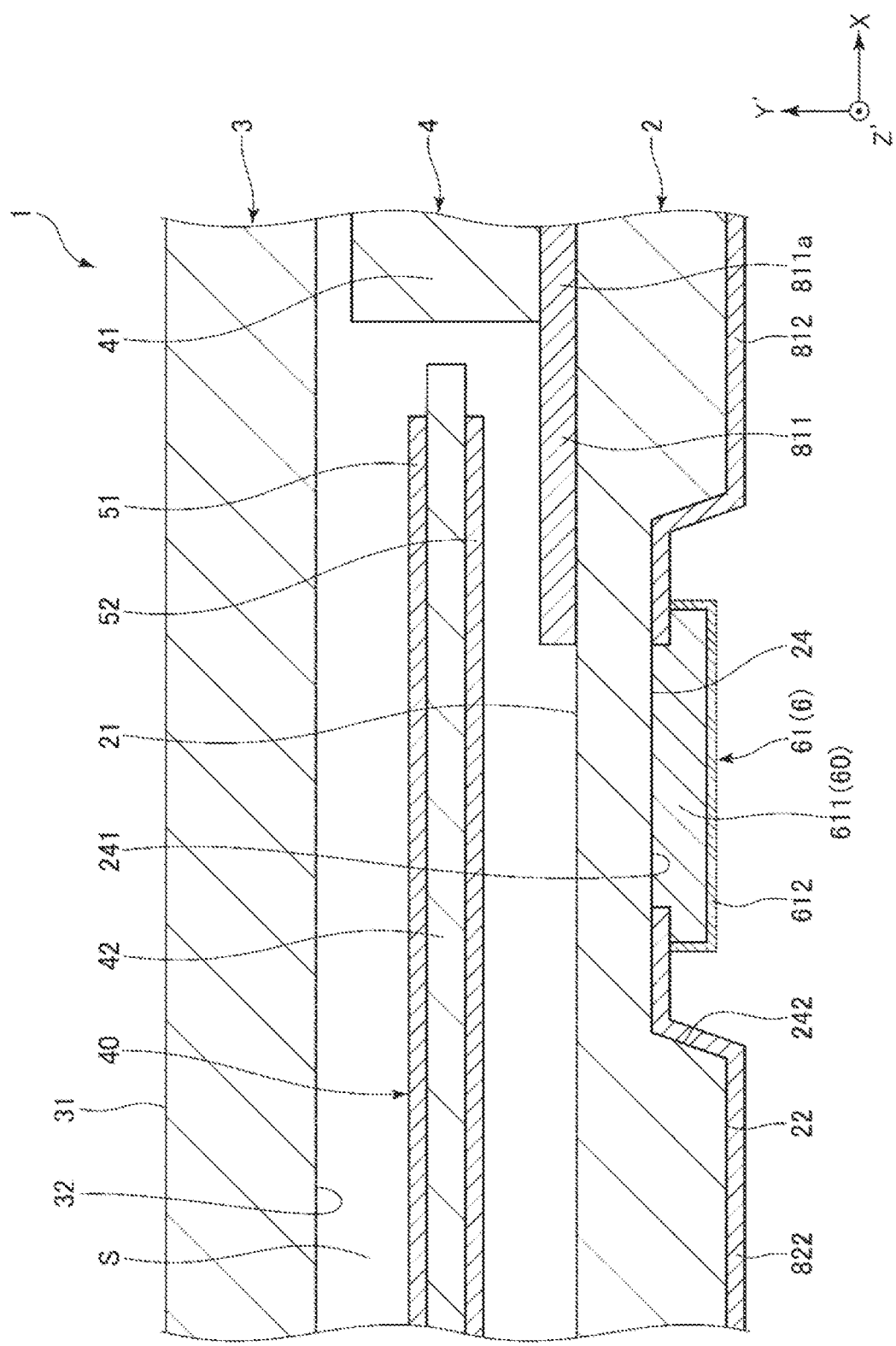
FIG. 10 is a cross-sectional view illustrating a vibrator device according to a fourth embodiment.

FIG. 10 is a cross-sectional view illustrating a vibrator device according to a fourth embodiment. FIG. 10 is a cross-sectional view corresponding to a cross section taken along line X-X of FIG. 4.

The vibrator device 1 according to the present embodiment is the same as the vibrator device 1 according to the third embodiment described above, except that a configuration of the first substrate 2 is different therefrom. In the following description, the vibrator device 1 according to the fourth embodiment will be described by focusing on a difference from the above-described third embodiment, and description on the same item will be omitted. Further, in FIG. 10, the same configuration as in the above-described embodiment will be denoted by the same reference numeral.

As illustrated in FIG. 10, the first substrate 2 includes a concave portion 24 opened in the lower surface 22 thereof. The thermistor element 61 is disposed on the bottom surface 241 of the concave portion 24. Thereby, a height of the vibrator device 1 can be reduced as compared with the above-described third embodiment.

Further, a side surface of the concave portion 24 is an inclined surface 242 that is inclined with respect to the thickness direction of the first substrate 2, that is, the Y' axis, and the bottom surface 241 is gently coupled to the lower surface 22 by the inclined surface 242. Further, each of the external terminals 812 and 822 electrically coupled to the thermistor element 61 is disposed on the bottom surface 241, the inclined surface 242, and the lower surface 22. In other words, the external terminals 812 and 822 extract from the bottom surface 241 to the lower surface through the inclined surface 242. As such, by configuring the side surface of the concave portion 24 as the inclined surface 242, decoupling of the external terminals 812 and 822 passing through the portions can be effectively suppressed.

As described above, in the vibrator device 1 according to the present embodiment, the first substrate 2 includes the concave portion 24 opened in the lower surface 22, and the thermistor element 61 is disposed on the bottom surface 241 of the concave portion 24. Thereby, for example, a height of the vibrator device 1 can be reduced as compared with the above-described third embodiment.

Further, as described above, the vibrator device 1 includes the functional element wire 8 as a wire that is disposed on the lower surface 22 and is electrically coupled to the thermistor element 61. Further, the side surface of the concave portion 24 is the inclined surface 242 that is inclined with respect to the thickness direction of the first substrate 2. The functional element wire 8 is disposed on the bottom surface 241, the inclined surface 242, and the lower surface 22. As such, by configuring the side surface of the concave portion 24 as the inclined surface 242, decoupling of the functional element wire 8 can be effectively suppressed.

According to the above-described fourth embodiment, the same effect as in the above-described first embodiment can also be obtained.

Fifth Embodiment

Figure 11:
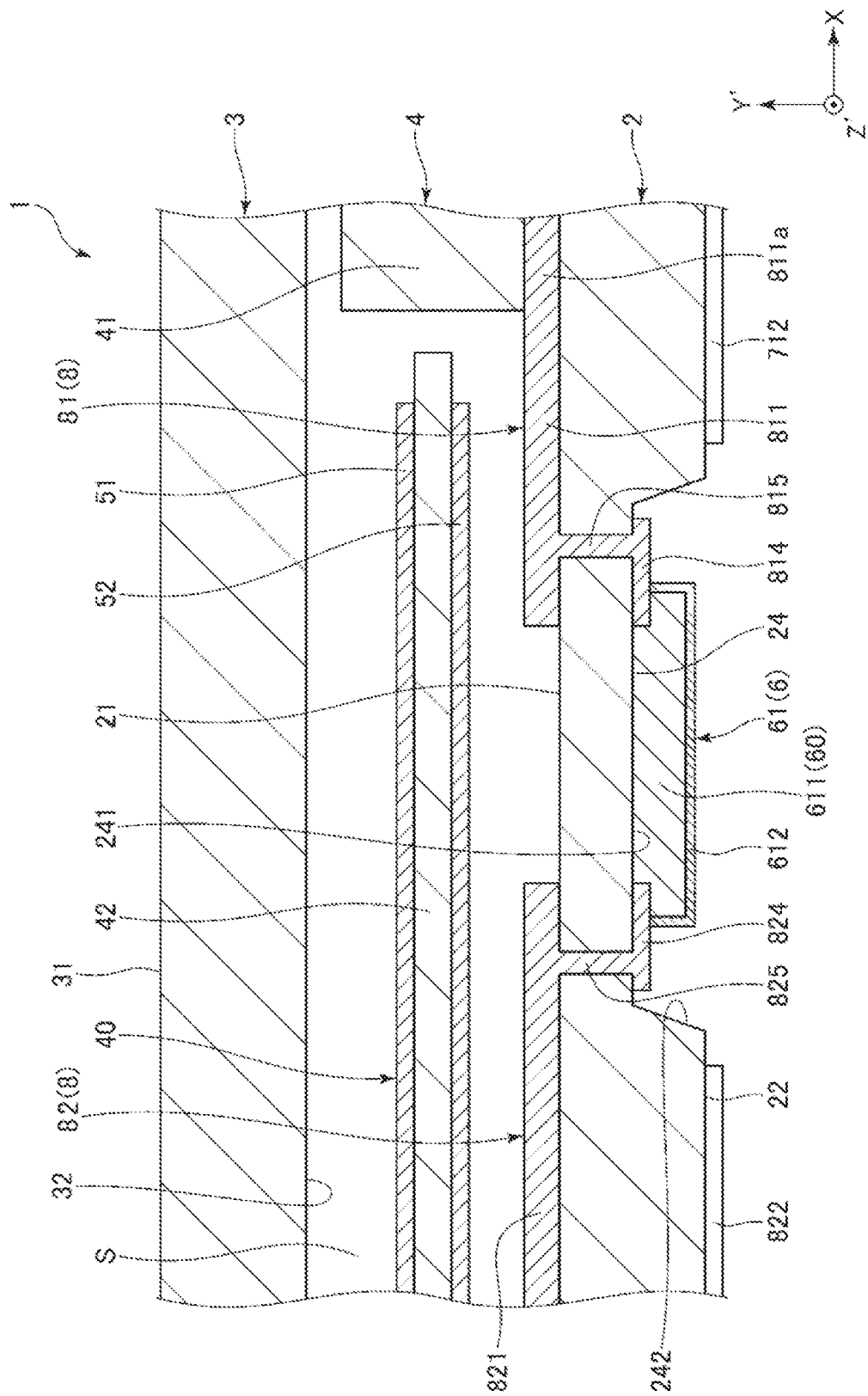
FIG. 11 is a cross-sectional view illustrating a vibrator device according to a fifth embodiment.

FIG. 11 is a cross-sectional view illustrating a vibrator device according to a fifth embodiment. FIG. 11 is a cross-sectional view corresponding to a cross section taken along line XI-XI of FIG. 4.

The vibrator device 1 according to the present embodiment is the same as the vibrator device 1 according to the above-described fourth embodiment except that a configuration of the functional element wire 8 is different therefrom. In the following description, the vibrator device 1 according to the fifth embodiment will be described by focusing on a difference from the fourth embodiment described above, and description on the same item will be omitted. In FIG. 11, the same configuration as in the above-described embodiment will be denoted by the same reference numeral.

As illustrated in FIG. 11, the first functional element wire 81 includes an external wire 814 that is disposed on the bottom surface 241 of the concave portion 24 and is electrically coupled to the thermistor element 61, and a through-electrode 815 that passes through the bottom surface 241 and the upper surface 21 and electrically couples the external wire 814 to the internal wire 811, in addition to the internal wire 811, the external terminal 812, and the through-electrode 813 described above. Likewise, the second functional element wire 82 further includes an external wire 824 that is disposed on the bottom surface 241 of the concave portion 24 and is electrically coupled to thermistor element 61, and a through-electrode 825 that passes through the bottom surface 241 and the upper surface 21 and electrically couples the external wire 824 to the internal wire 821, in addition to the internal wire 821, the external terminal 822, and the through-electrode 823 described above. In FIG. 11, the external terminal 812 and the through-electrodes 813 and 823 are not illustrated.

According to the fifth embodiment described above, the same effect as in the first embodiment can also be obtained.

Sixth Embodiment

Figure 12:
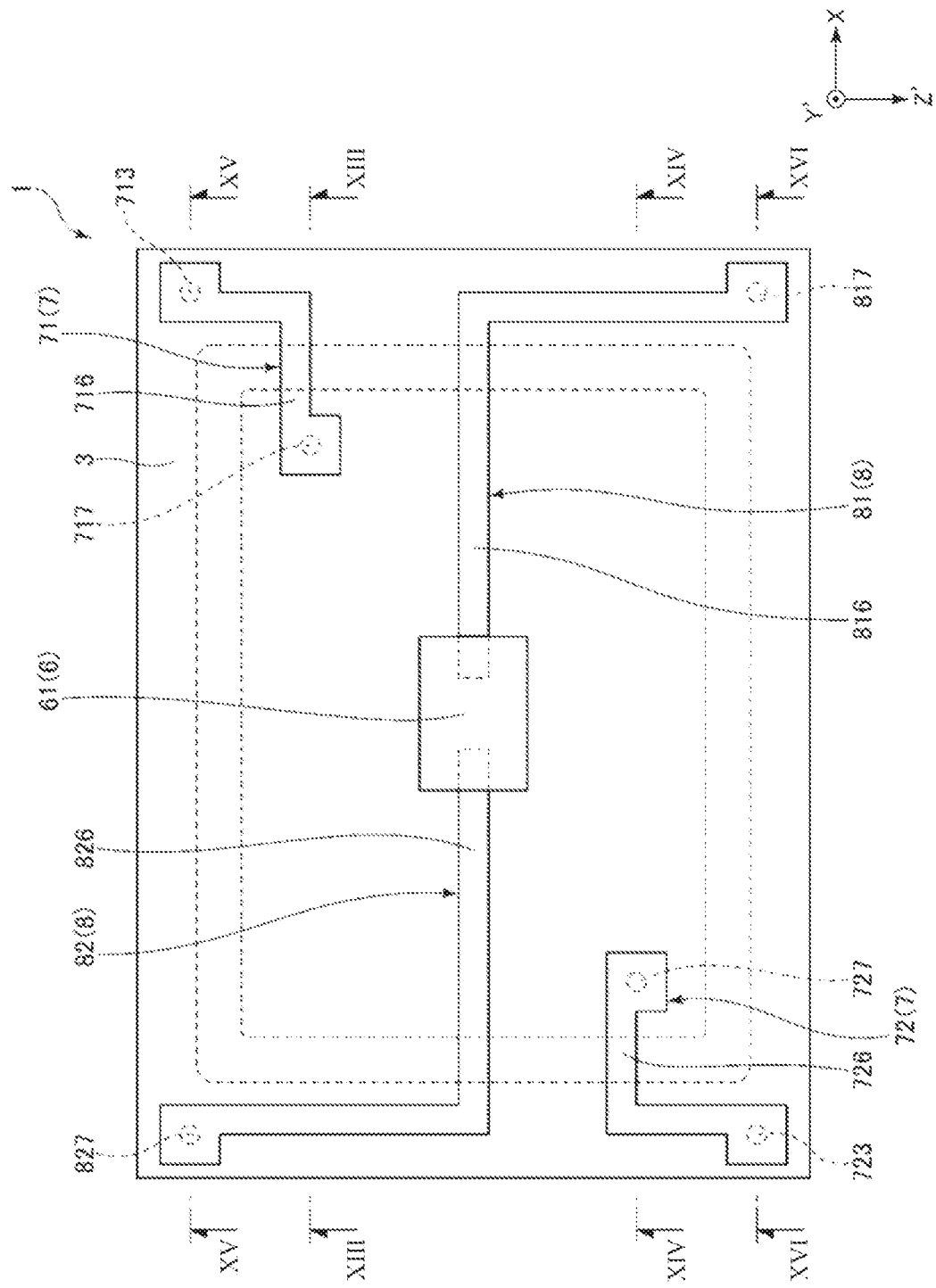
FIG. 12 is a top view illustrating a vibrator device according to a sixth embodiment.
Figure 13:
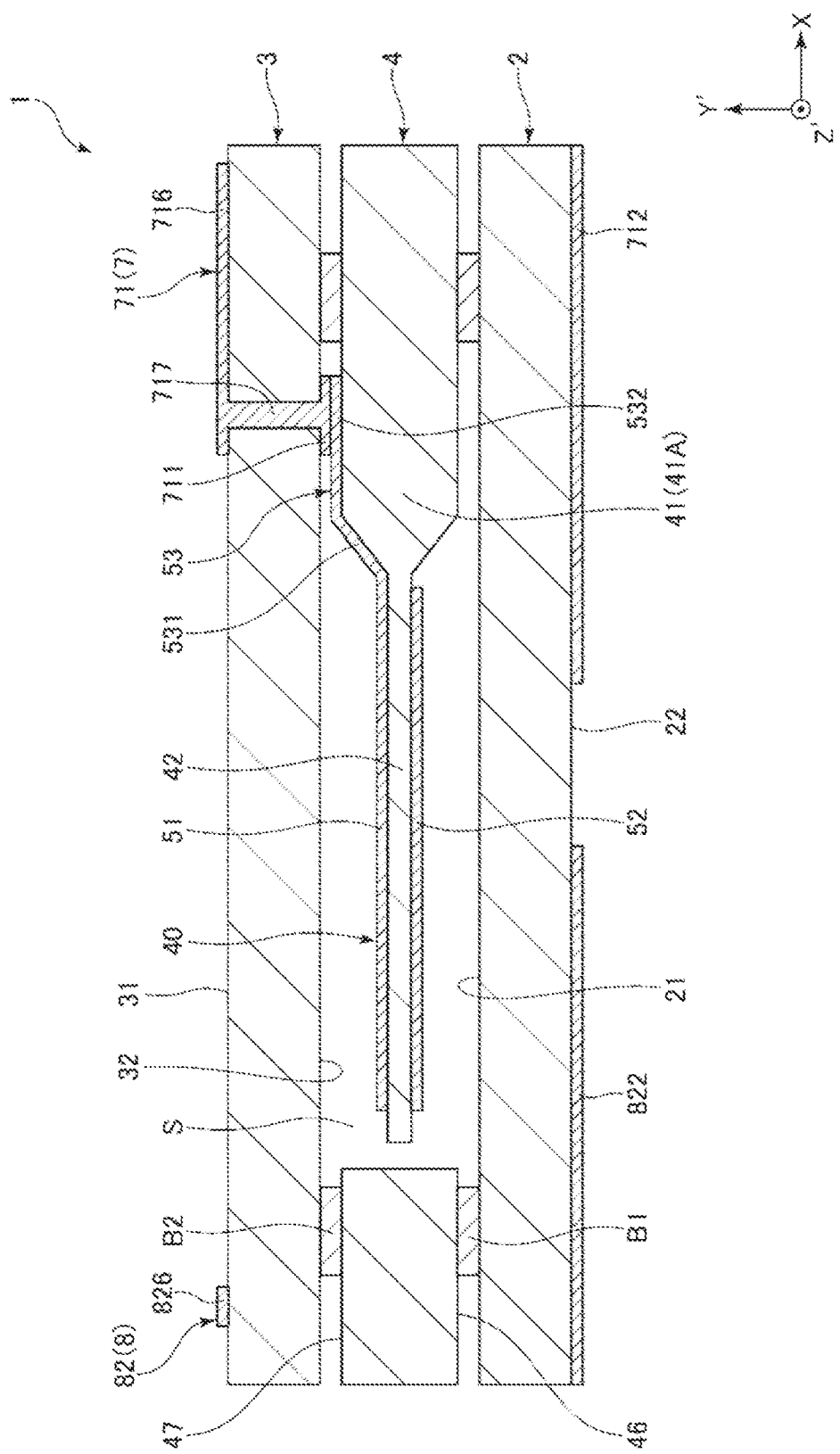
FIG. 13 is a cross-sectional view taken along line XIII-XIII of FIG. 12.
Figure 14:
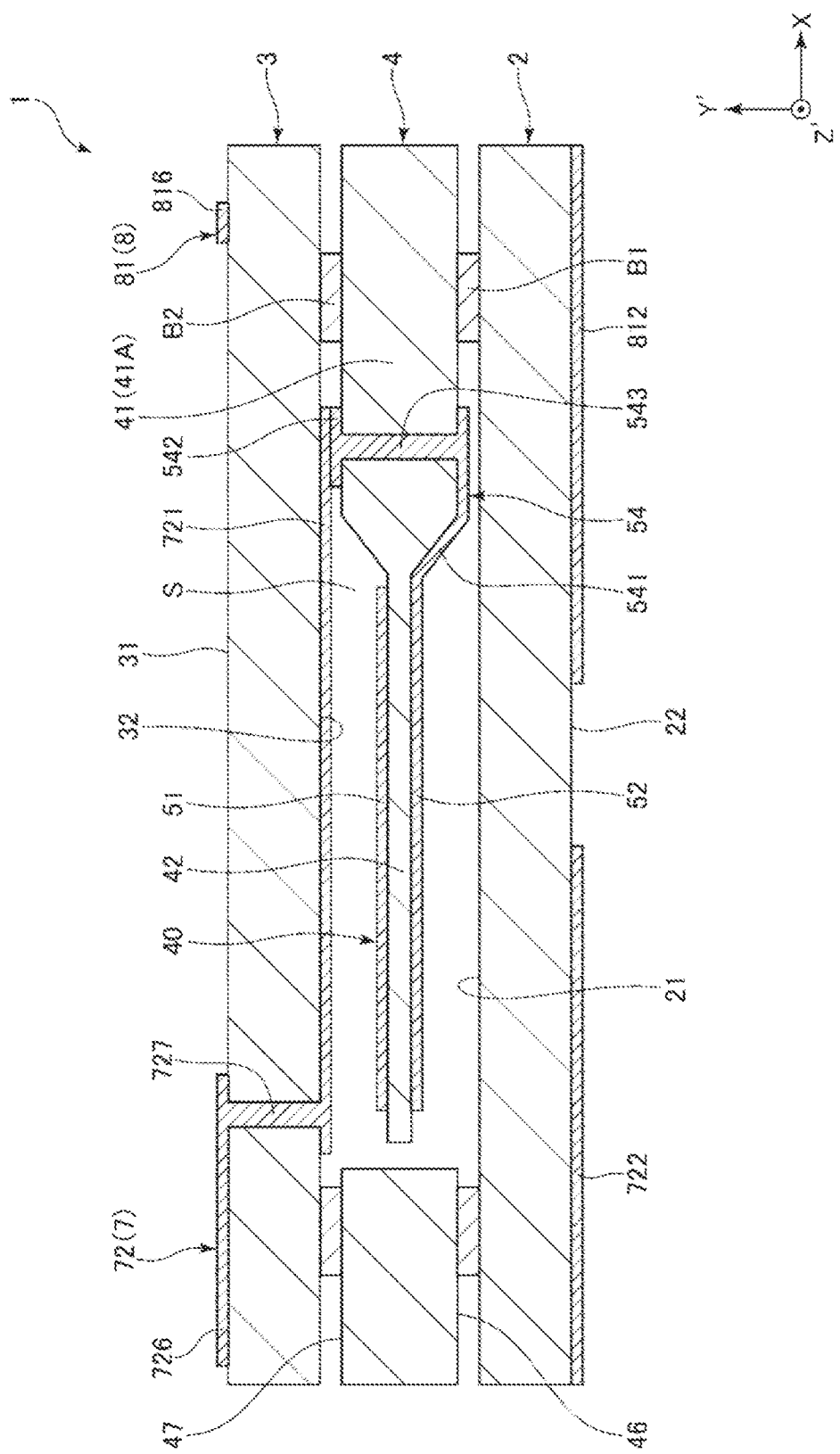
FIG. 14 is a cross-sectional view taken along line XIV-XIV of FIG. 12.
Figure 15:
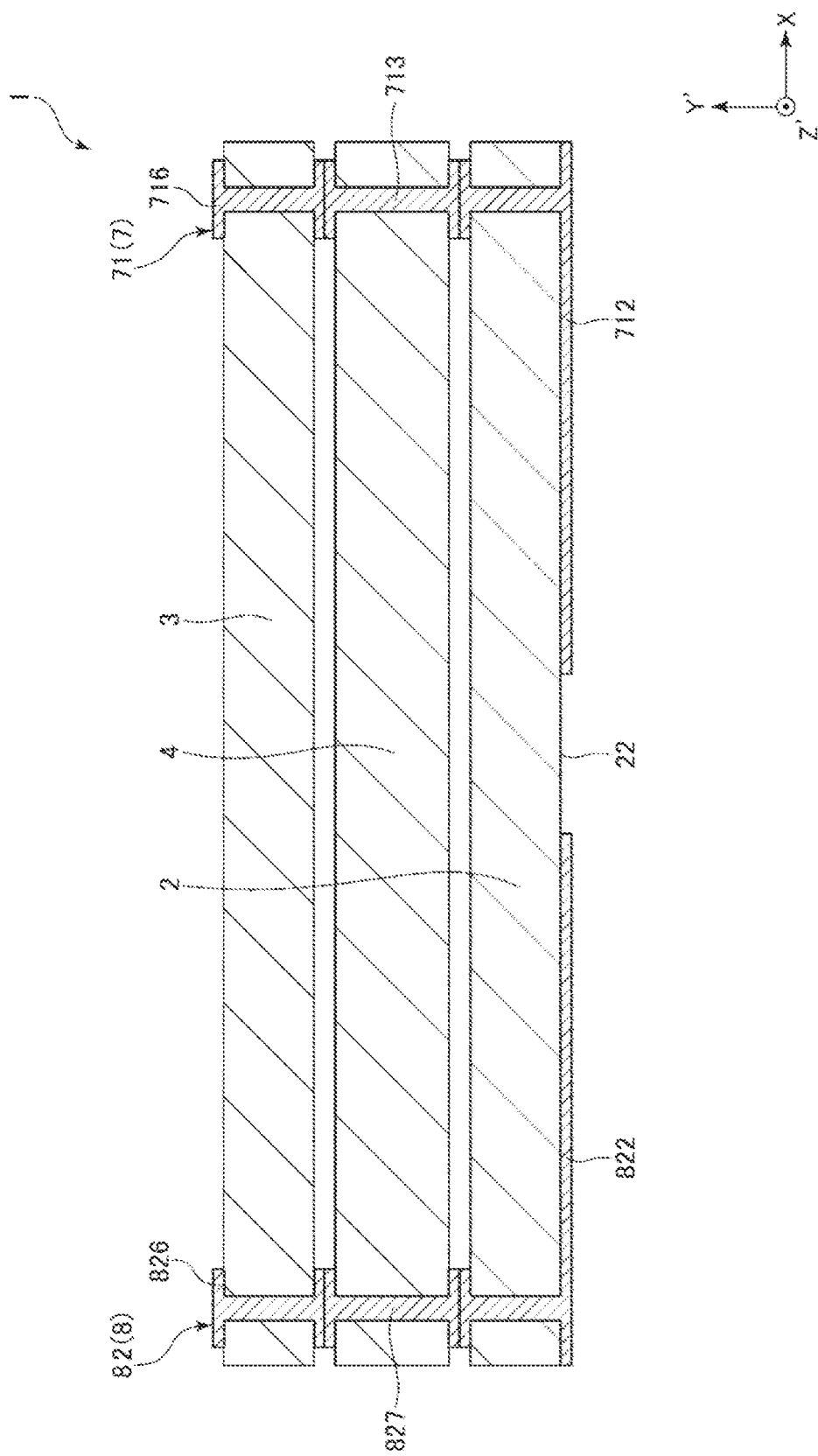
FIG. 15 is a cross-sectional view taken along line XV-XV of FIG. 12.
Figure 16:
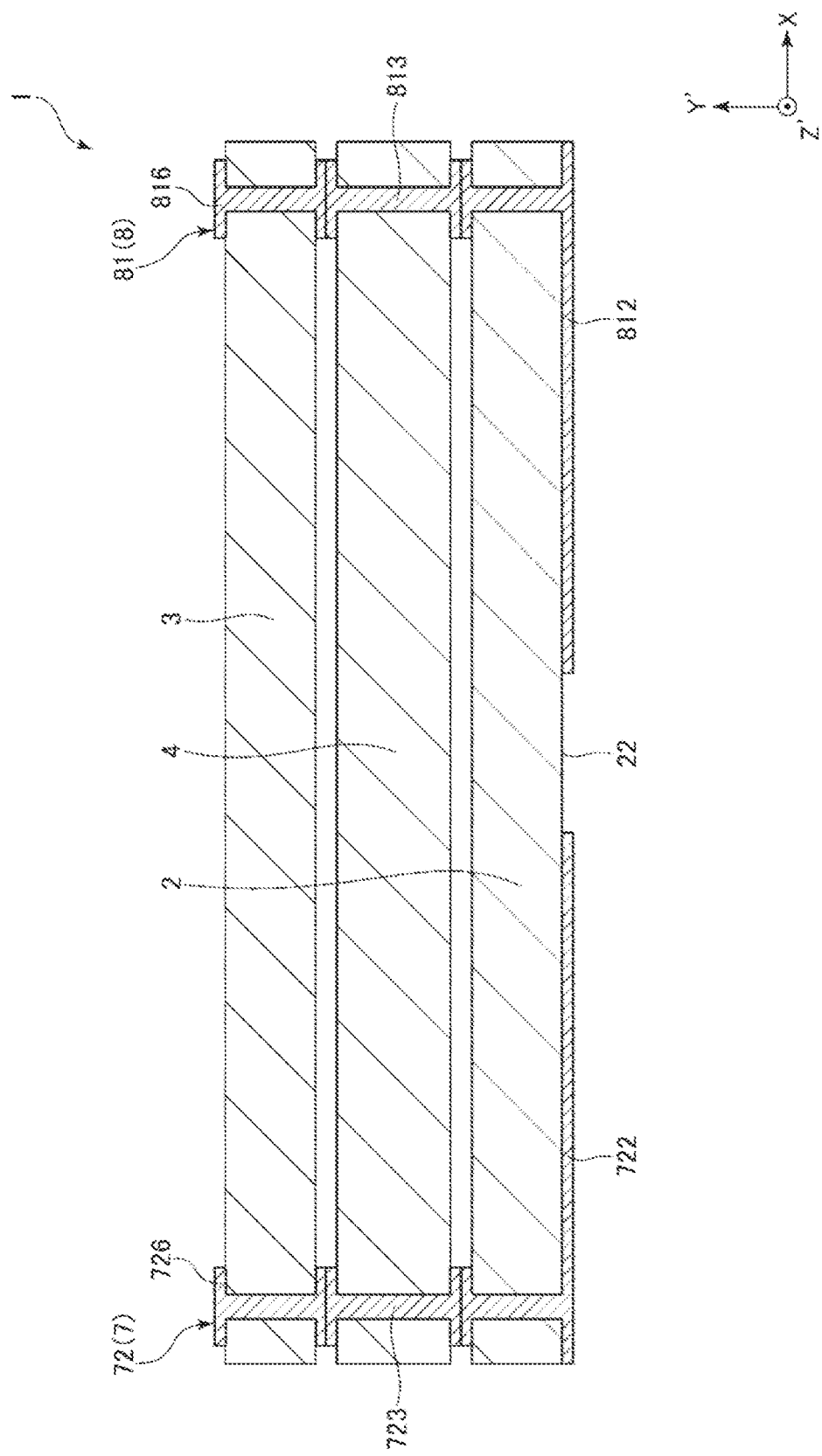
FIG. 16 is a cross-sectional view taken along line XVI-XVI of FIG. 12.

FIG. 12 is a top view illustrating a vibrator device according to a sixth embodiment. FIG. 13 is a cross-sectional view taken along line XIII-XIII of FIG. 12. FIG. 14 is a cross-sectional view taken along line XIV-XIV of FIG. 12. FIG. 15 is a cross-sectional view taken along line XV-XV of FIG. 12. FIG. 16 is a cross-sectional view taken along line XVI-XVI of FIG. 12.

The vibrator device 1 according to the present embodiment is the same as the vibrator device 1 of the above-described first embodiment except that disposition of the functional element 6 and configurations of the electrode 5, the vibration element wire 7, and the functional element wire 8 are different therefrom. In the following description, the vibrator device 1 according to the sixth embodiment will be described by focusing on a difference from the first embodiment described above, and description on the same item will be omitted. In FIGS. 12 to 16, the same configurations as in the above-described embodiment are denoted by the same reference numerals.

As illustrated in FIG. 12, in the vibrator device according to the present embodiment, the thermistor element 61 serving as the functional element 6 is disposed on an upper surface of the second substrate 3.

As illustrated in FIG. 13, the first extraction electrode 53 includes the wire 531 extending from the first excitation electrode 51 through the connector 43 to an upper surface of the extender 41A, and the coupling terminal 532 that is disposed on the upper surface of the extender 41A and is electrically coupled to the wire 531. Meanwhile, as illustrated in FIG. 14, the second extraction electrode 54 includes the wire 541 extending from the second excitation electrode 52 through the connector 44 to a lower surface of the extender 41A, the coupling terminal 542 disposed on the upper surface of extender 41A, and the through-electrode 543 that passes through the extender 41A and electrically couples the wire 541 to the coupling terminal 542.

Further, as illustrated in FIGS. 12, 13, and 15, the first vibration element wire 71 includes the internal wire 711 that is disposed the lower surface of second substrate 3 and is in contact with the coupling terminal 532, an external wire 716 disposed on the upper surface of second substrate 3, a through-electrode 717 that passes through the second substrate 3 and electrically couples the internal wire 711 to the external wire 716, the external terminal 712 disposed on the lower surface 22 of the first substrate 2, and the through-electrode 713 that passes through the first substrate 2, the intermediate substrate 4, and the second substrate 3, and electrically couples the external wire 716 to the external terminal 712. The through-electrode 713 is formed outside the internal space S, that is, outside the first and second bonding members B1 and B2.

Meanwhile, as illustrated in FIGS. 12, 14, and 16, the second vibration element wire 72 includes the internal wire 721 that is disposed on the lower surface of second substrate 3 and is in contact with the coupling terminal 542, an external wire 726 disposed on the upper surface of second substrate 3, a through-electrode 727 that passes through the second substrate 3 and electrically couples the internal wire 721 to the external wire 726, the external terminal 722 disposed on the lower surface 22 of the first substrate 2, and the through-electrode 723 that passes through the first substrate 2, the intermediate substrate 4, and the second substrate 3 and electrically couples the external wire 726 to the external terminal 722. The through-electrode 723 is formed outside the internal space S, that is, outside the first and second bonding members B1 and B2.

Further, as illustrated in FIGS. 12 and 16, the first functional element wire 81 includes an external wire 816 that is disposed on the upper surface of second substrate 3 and is electrically coupled to thermistor element 61, the external terminal 812 disposed on the lower surface 22 of the first substrate 2, and a through-electrode 817 that passes through the first substrate 2, the intermediate substrate 4, and the second substrate 3 and electrically couples the external wire 816 to the external terminal 812. Further, the through-electrode 817 is formed outside the internal space S, that is, outside the first and second bonding members B1 and B2.

Meanwhile, as illustrated in FIGS. 12 and 15, the second functional element wire 82 includes an external wire 826 that is disposed on the upper surface of second substrate 3 and is electrically coupled to the thermistor element 61, the external terminal 822 disposed on the lower surface 22 of the first substrate 2, and a through-electrode 827 that passes through the first substrate 2, the intermediate substrate 4, and the second substrate 3 and electrically couples the external wire 826 to the external terminal 822. Further, the through-electrode 827 is formed outside the internal space S, that is, outside the first and second bonding members B1 and B2.

According to the sixth embodiment described above, the same effect as in the first embodiment can be obtained.

Seventh Embodiment

Figure 17:
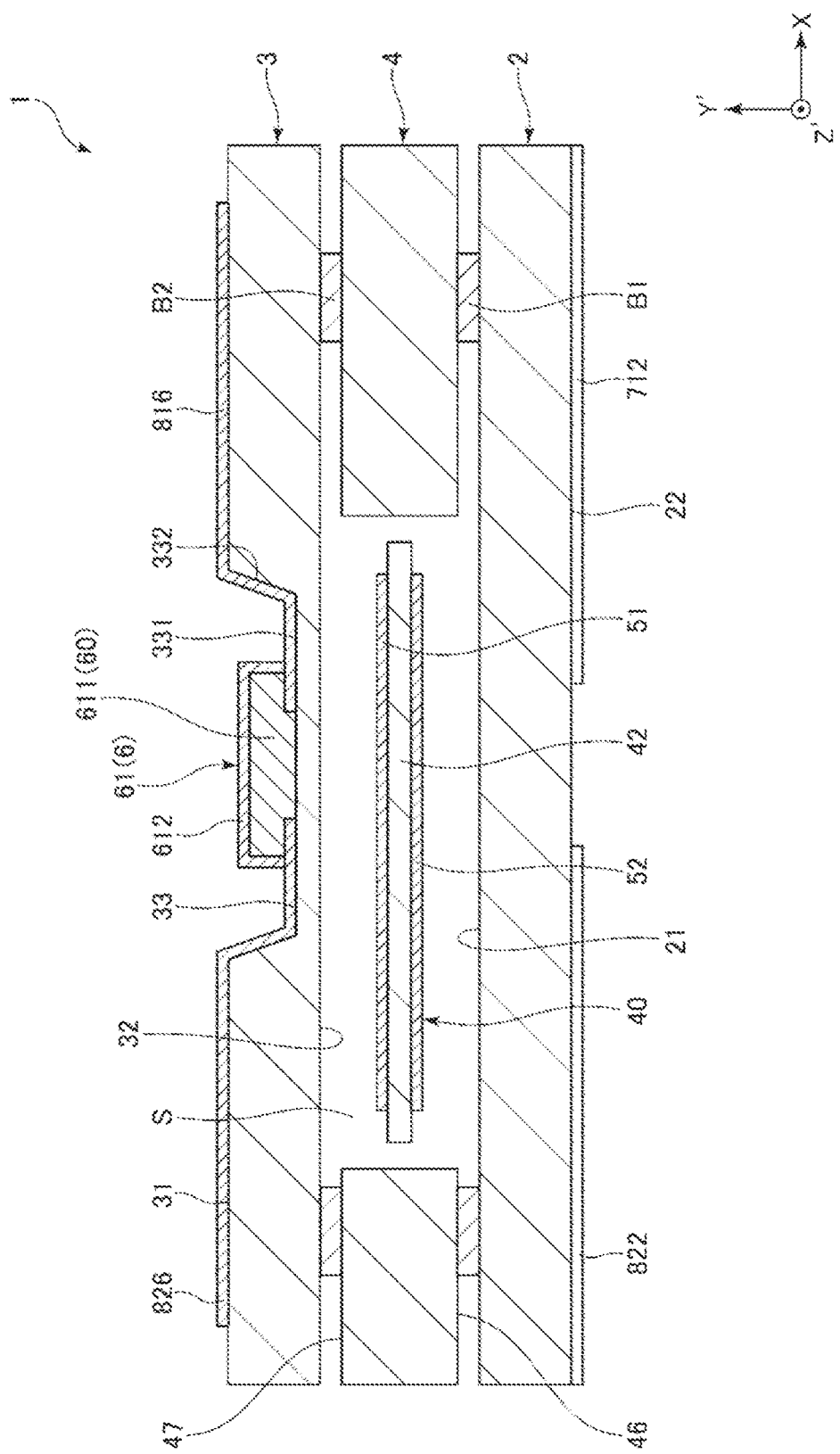
FIG. 17 is a cross-sectional view illustrating a vibrator device according to a seventh embodiment.

FIG. 17 is a cross-sectional view illustrating a vibrator device according to a seventh embodiment.

The vibrator device 1 according to the present embodiment is the same as the vibrator device 1 according to the above-described sixth embodiment except that a configuration of the second substrate 3 is different therefrom. In the following description, the vibrator device 1 according to the seventh embodiment will be described by focusing on a difference from the first embodiment described above, and description on the same item will be omitted. In FIG. 17, the same configuration as in the above-described embodiment will be denoted by the same reference numeral.

As illustrated in FIG. 17, the second substrate 3 includes a concave portion 33 opened in the upper surface 31 thereof. The thermistor element 61 is disposed on the bottom surface 331 of the concave portion 33. Thereby, for example, a height of the vibrator device 1 can be reduced as compared with the above-described sixth embodiment.

A side surface of the concave portion 33 is an inclined surface 332 that is inclined with respect to a thickness direction of the second substrate 3, that is, the Y' axis, and the bottom surface 331 and the upper surface 31 are gently coupled by the inclined surface 332. Each of the external wires 816 and 826 electrically coupled to the thermistor element 61 is disposed on the bottom surface 331, the inclined surface 332, and the upper surface 31. In other words, the external wires 816 and 826 extract from the bottom surface 331 to the upper surface 31 through the inclined surface 332. As such, by configuring the side surface of the concave portion 33 as the inclined surface 332, decoupling of the external wires 816 and 826 passing through the portions can be effectively suppressed.

According to the seventh embodiment described above, the same effect as in the first embodiment can be obtained.

Eighth Embodiment

Figure 18:
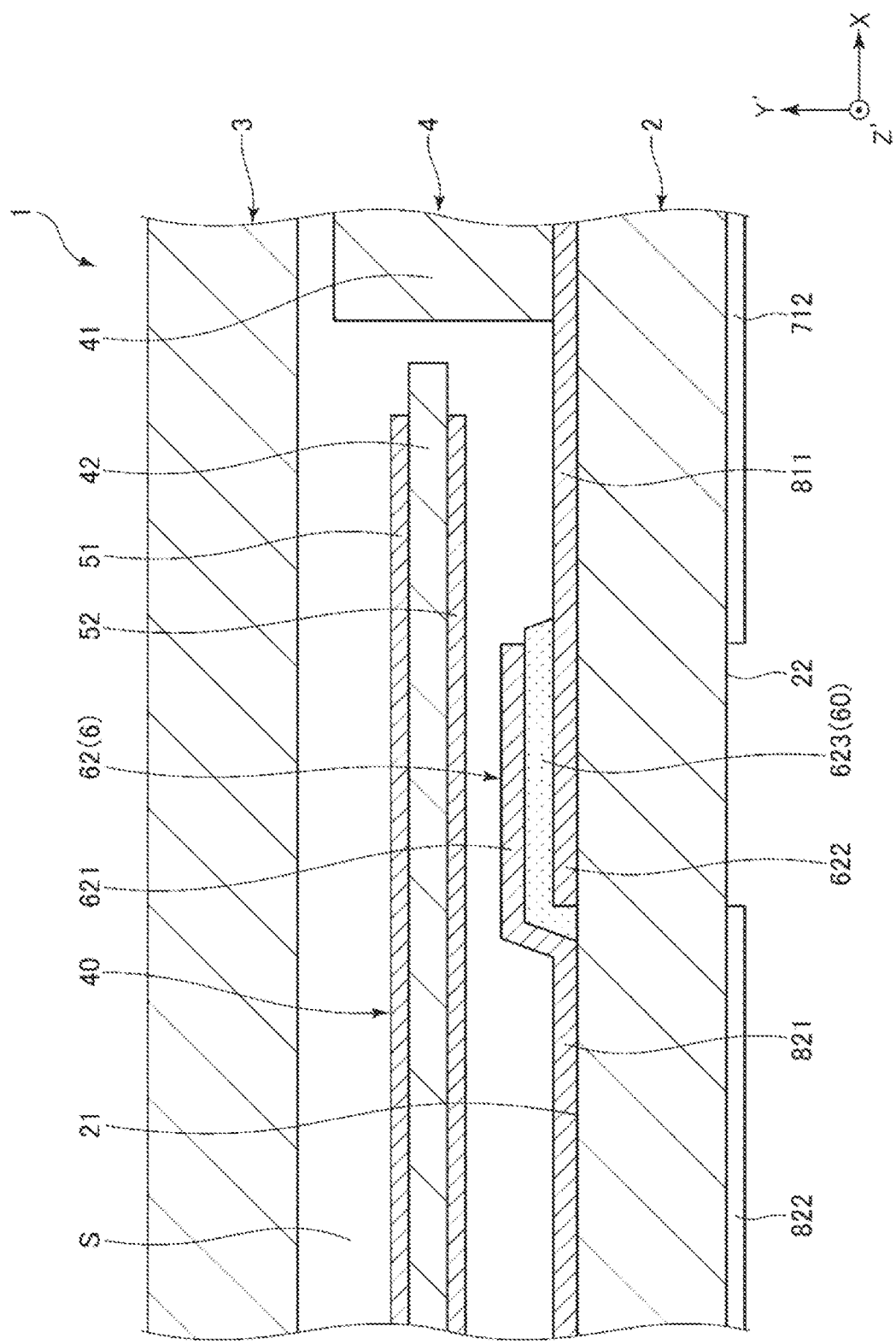
FIG. 18 is a cross-sectional view illustrating a vibrator device according to an eighth embodiment.

FIG. 18 is a cross-sectional view illustrating a vibrator device according to an eighth embodiment. FIG. 18 is a cross-sectional view corresponding to a cross section taken along line XVIII-XVIII of FIG. 4.

The vibrator device 1 according to the present embodiment is the same as the vibrator device 1 according to the above-described first embodiment except that a configuration of the functional element 6 is different therefrom. In the following description, the vibrator device 1 according to the eighth embodiment will be described by focusing on a difference from the above-described first embodiment, and description on the same item will be omitted. Further, in FIG. 18, the same configuration as in the above-described embodiment will be denoted by the same reference numeral.

In the vibrator device 1 illustrated in FIG. 18, the functional element 6 is a capacitor 62. The capacitor 62 is a thin film capacitor and includes an upper electrode 621, a lower electrode 622, and a dielectric layer 623 serving as the functional layer 60 interposed between the upper electrode 621 and the lower electrode 622. The upper electrode 621 is electrically coupled to the internal wire 821, and the lower electrode 622 is electrically coupled to the internal wire 811.

According to the eighth embodiment, the same effect as in the first embodiment can also be obtained.

Ninth Embodiment

Figure 19:
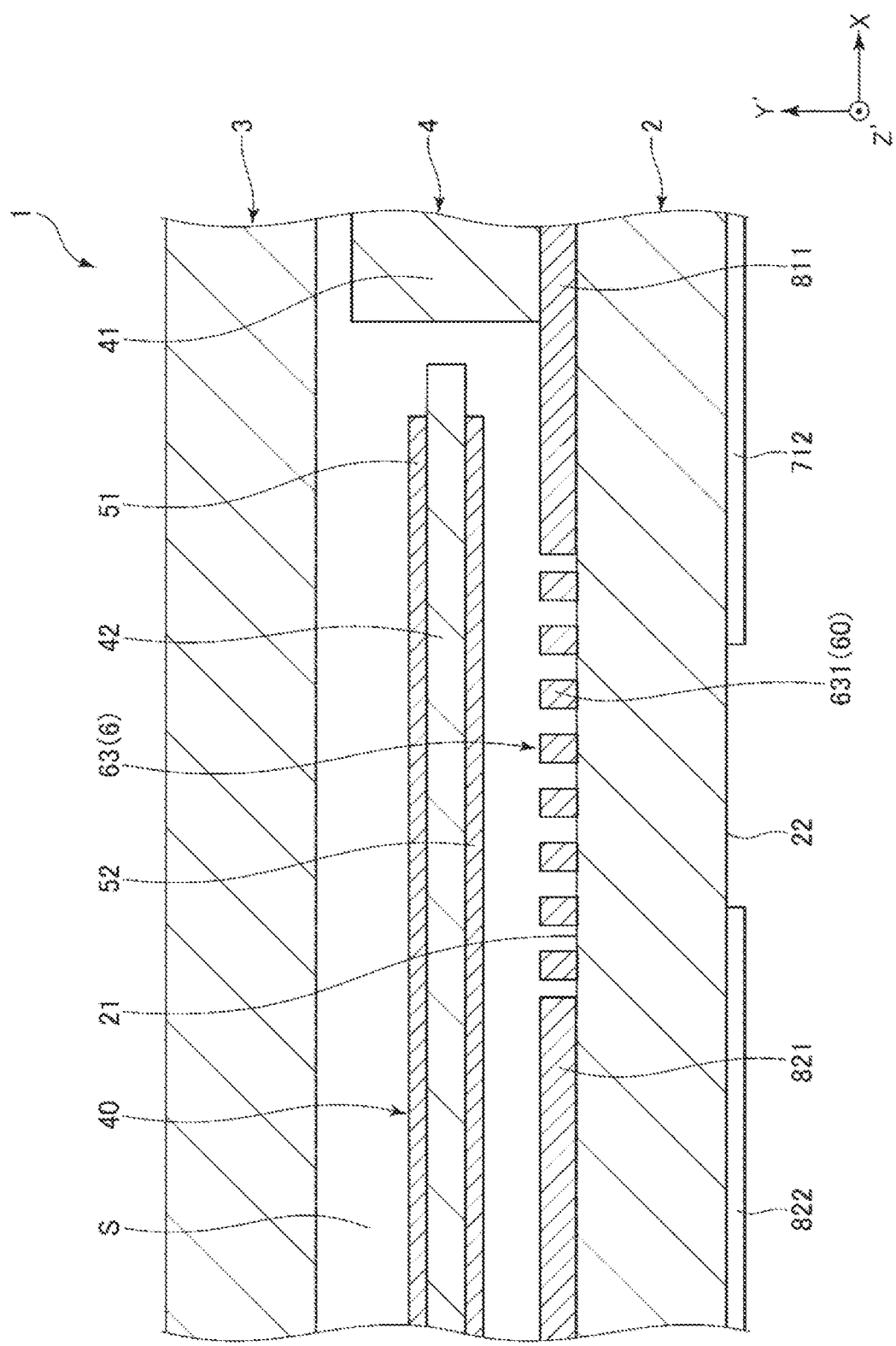
FIG. 19 is a cross-sectional view illustrating a vibrator device according to a ninth embodiment.

FIG. 19 is a cross-sectional view illustrating a vibrator device according to a ninth embodiment. FIG. 19 is a cross-sectional view corresponding to a cross section taken along line XIX-XIX of FIG. 4.

The vibrator device 1 according to the present embodiment is the same as the vibrator device 1 according to the above-described first embodiment except that a configuration of the functional element 6 is different therefrom. In the following description, the vibrator device 1 according to the ninth embodiment will be described by focusing on a difference from the first embodiment described above, and description on the same item will be omitted. In FIG. 19, the same configuration as in the above-described embodiment will be denoted by the same reference numeral.

In the vibrator device 1 illustrated in FIG. 19, the functional element 6 is an inductor 63. The inductor 63 includes a wire pattern 631 serving as the functional layer 60 that is disposed on the upper surface 21 of the first substrate 2 and is electrically coupled to the internal wires 811 and 821.

According to the ninth embodiment, the same effect as in the first embodiment can also be obtained.

Tenth Embodiment

Figure 20:
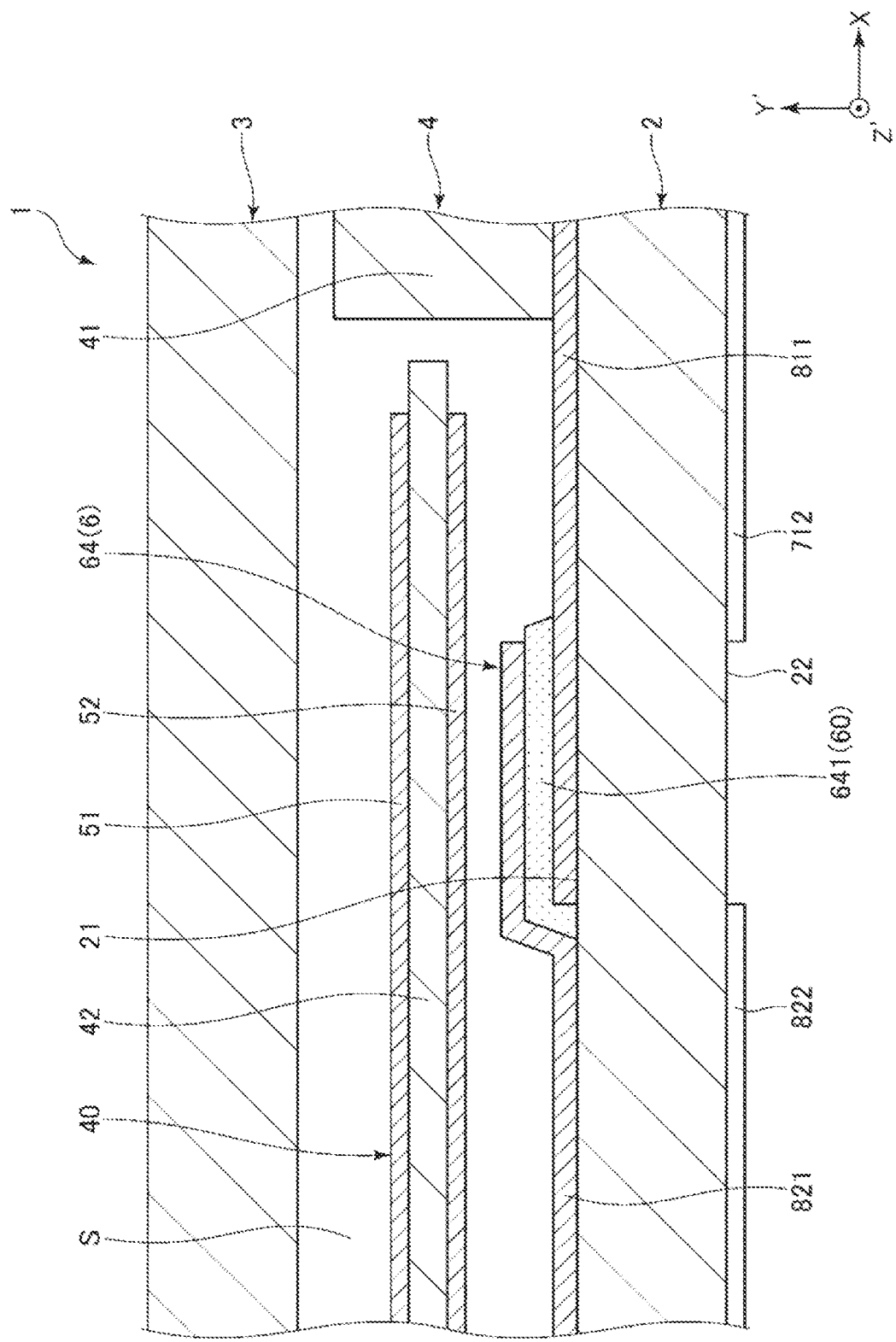
FIG. 20 is a cross-sectional view illustrating a vibrator device according to a tenth embodiment.

FIG. 20 is a cross-sectional view illustrating a vibrator device according to a tenth embodiment. FIG. 20 is a cross-sectional view corresponding to a cross section taken along line XX-XX of FIG. 4.

The vibrator device 1 according to the present embodiment is the same as the vibrator device 1 according to the above-described first embodiment except that a configuration of the functional element 6 is different therefrom. In the following description, the vibrator device 1 according to the tenth embodiment will be described by focusing on a difference from the first embodiment described above, and description on the same item will be omitted. Further, in FIG. 20, the same configuration as in the above-described embodiment will be denoted by the same reference numeral.

In the vibrator device 1 illustrated in FIG. 20, the functional element 6 is a heater element 64. The heater element 64 includes a heater film 641 serving as the functional layer 60 which is disposed on the upper surface 21 of the first substrate 2 and is electrically coupled to the internal wires 811 and 821. The heater film 641 is formed of a material that easily generates heat by Joule heat when a current flows, that is, a material suitable for resistance heat, and a tantalum aluminum alloy thin film can be used as the material.

The vibrator device 1 having the configuration can be applied to an oven controlled crystal oscillator (OCXO) including a heater control circuit and an oscillation circuit. Specifically, a small OCXO can be provided by electrically coupling the heater element 64 to the heater control circuit and by coupling the vibration element 40 to the oscillation circuit.

According to the tenth embodiment, the same effect as in the first embodiment can also be obtained.

Eleventh Embodiment

Figure 21:
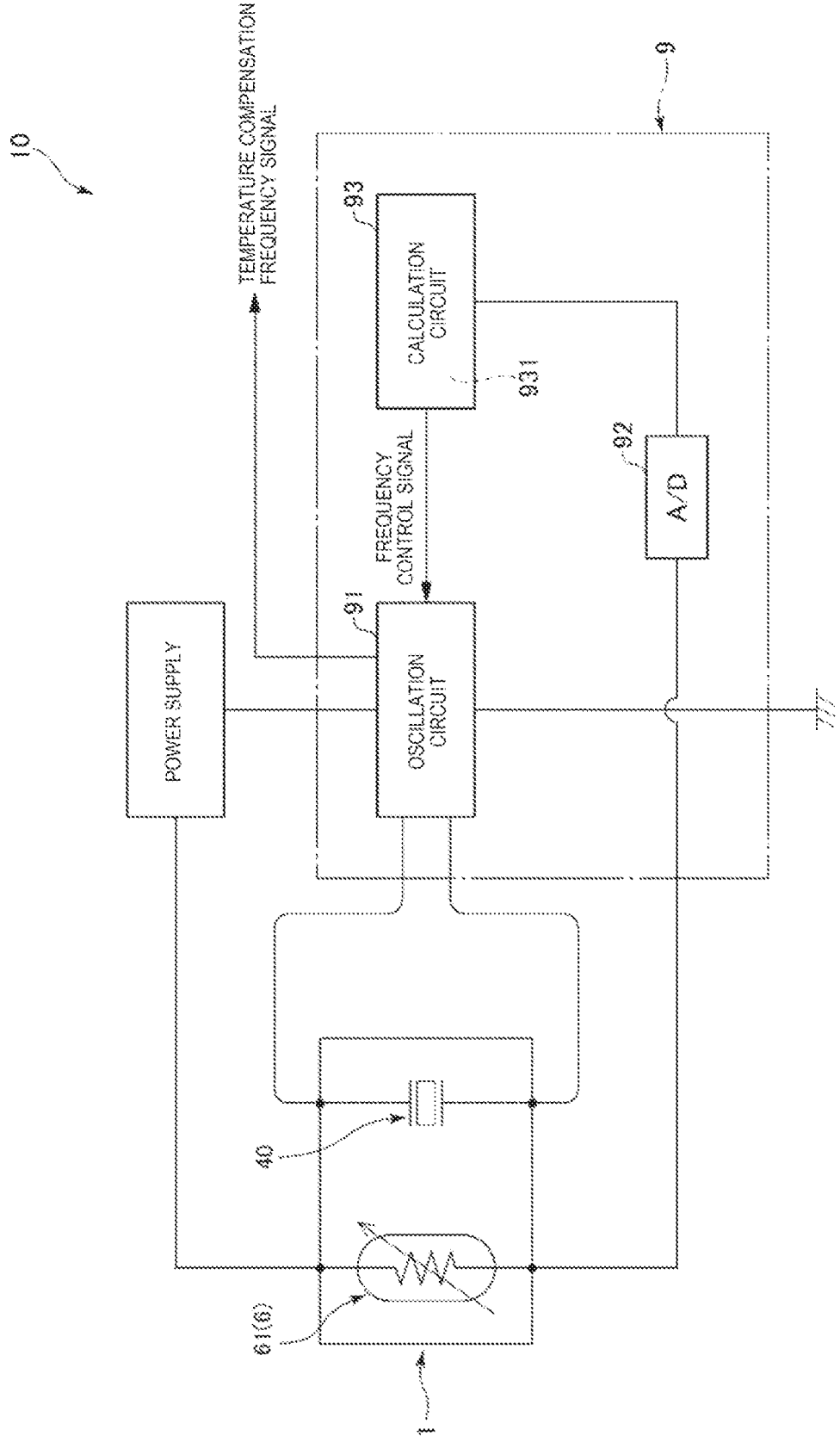
FIG. 21 is a block diagram illustrating a circuit configuration of an electronic apparatus according to an eleventh embodiment.

FIG. 21 is a block diagram illustrating a circuit configuration of an electronic apparatus according to an eleventh embodiment.

As illustrated in FIG. 21, the electronic apparatus 10 includes the vibrator device 1 and a circuit 9 electrically coupled to the vibrator device 1. Further, the circuit 9 includes an oscillation circuit 91 that oscillates the vibration element 40, an A/D converter 92 that converts an analog signal (temperature information) output from the thermistor element 61 as the functional element 6 into a digital signal, and a calculation circuit 93 which receives the digital signal output from the A/D converter 92. The calculation circuit 93 includes a temperature compensation circuit 931, and the temperature compensation circuit 931 generates a frequency control signal based on the digital signal output from the A/D converter 92 and outputs the frequency control signal to the oscillation circuit 91. The oscillation circuit 91 generates a temperature compensation frequency signal based on the frequency control signal and outputs the temperature compensation frequency signal.

The electronic apparatus 10 is used as an oscillator, and can be built in, for example, a personal computer, a digital still camera, a smartphone, a tablet terminal, a timepiece, an ink jet printer, a television, a head mounted display (HMD), a video camera, a car navigation device, a pager, an electronic dictionary, a calculator, an electronic game machines, a workstation, a POS terminal, a medical apparatus (for example, an electronic thermometer, a sphygmomanometer, a blood glucose meter, an electrocardiogram measurement device, an ultrasonic diagnostic device, an electronic endoscope), a fish finder, various measurement apparatuses, a mobile terminal base station apparatus, instruments (for example, instruments for a vehicle, an aircraft, and a ship), a flight simulator, a network server, and the like.

As described above, the electronic apparatus 10 includes the vibrator device 1, the oscillation circuit 91 that oscillates the vibration element 40, the A/D converter 92 that converts an analog signal output from the functional element 6 into a digital signal, the calculation circuit 93 that receives the digital signal output from the A/D converter 92. Thereby, the effect of the vibrator device 1 described above can be obtained, and the electronic apparatus 10 can have a high reliability.

A configuration of the electronic apparatus 10 is not limited in particular. For example, the calculation circuit 93 may not be configured to generate a frequency control signal based on the digital signal output from the A/D converter 92 and output the frequency control signal to the oscillation circuit 91. That is, the digital signal output from the A/D converter 92 may not be used for frequency compensation.

Twelfth Embodiment

Figure 22:
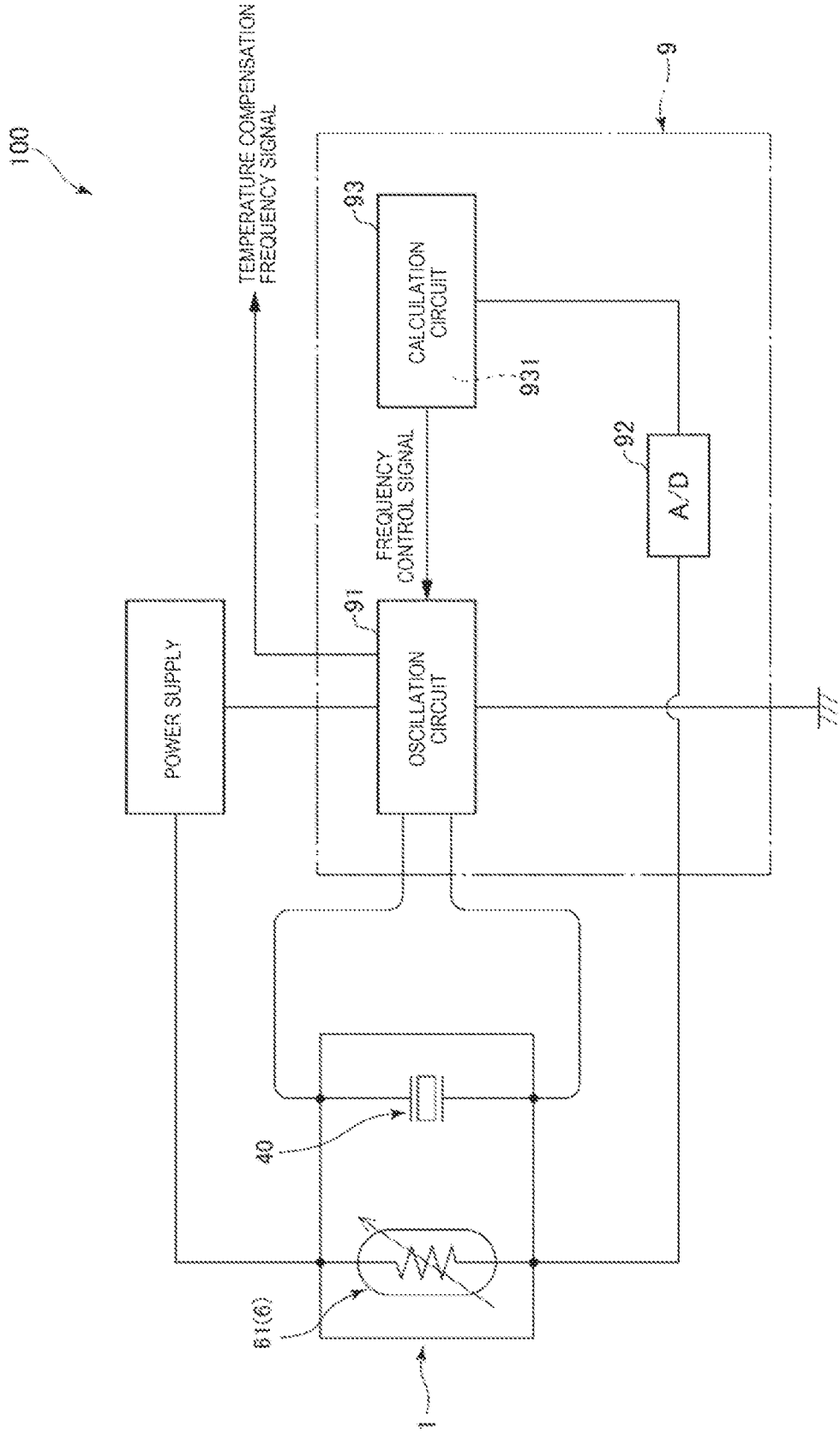
FIG. 22 is a block diagram illustrating a circuit configuration of a vehicle according to a twelfth embodiment.

FIG. 22 is a block diagram illustrating a circuit configuration of a vehicle according to a twelfth embodiment.

An automobile 100 serving as a vehicle illustrated in FIG. 22 includes the vibrator device 1 and the circuit 9 electrically coupled to the vibrator device 1. Further, the circuit 9 includes an oscillation circuit 91 that oscillates the vibration element 40, an A/D converter 92 that converts an analog signal (temperature information) output from the thermistor element 61 as the functional element 6 into a digital signal, and a calculation circuit 93 which receives the digital signal output from the A/D converter 92. The calculation circuit 93 includes the temperature compensation circuit 931, and the temperature compensation circuit 931 generates the frequency control signal based on the digital signal output from the A/D converter 92 and outputs the frequency control signal to the oscillation circuit 91. The oscillation circuit 91 generates the temperature compensation frequency signal based on the frequency control signal and outputs the temperature compensation frequency signal.

The electronic apparatus 10 is used as an oscillator, and is used for controlling an electronic control unit (ECU) such as, a keyless entry, an immobilizer, a car navigation system, a car air conditioner, an anti-lock brake system (ABS), an airbag, a tire pressure monitoring system (TPMS), an engine control, a battery monitor of a hybrid vehicle or an electric vehicle, or a vehicle body posture control system, which is built in the automobile 100.

As described above, the automobile 100 serving as a vehicle includes the vibrator device 1, the oscillation circuit 91 that oscillates the vibration element 40, the A/D converter 92 that converts an analog signal output from the functional element 6 into a digital signal, and a calculation circuit 93 which receives the digital signal output from the A/D converter 92. Thereby, the effect of the vibrator device 1 described above can be obtained, and the automobile 100 can have a high reliability.

The configuration of the automobile 100 is not limited in particular. For example, the calculation circuit 93 may not be configured to generate a frequency control signal based on the digital signal output from the A/D converter 92 and output the frequency control signal to the oscillation circuit 91. That is, the digital signal output from the A/D converter 92 may not be used for frequency compensation. Further, the vehicle is not limited to the automobile 100 and can be applied to, for example, an airplane, a ship, an automated guided vehicle (AGV), a bipedal walking robot, an unmanned airplane such as a drone, and the like.

As described above, although the vibrator device, the electronic apparatus, and the vehicle according to the present application example are described based on the illustrated embodiment, the present application example is not limited to this, and a configuration of each portion can be replaced with any configuration having the same function. Further, any other configuration may be added to the present application example. Further, the present application example may be a combination of any two or more of the respective embodiments described above.

What is claimed is:
1. A vibrator device comprising:
an intermediate substrate that includes a frame having a first surface and a second surface opposite to the first surface and a vibration element and that is formed of quartz crystal;
a first substrate that is bonded to the first surface of the frame and is formed of quartz crystal or glass;
a second substrate that is bonded to the second surface of the frame and is formed of quartz crystal or glass; and
a functional element that is disposed on the first substrate and includes a functional layer, wherein
the functional element includes a portion overlapping the vibration element in plan view,
the first substrate includes a third surface on the vibration element side, and a concave portion opened on the third surface,
the functional element is disposed on a bottom surface of the concave portion,
a functional element wire is electrically coupled to the functional element, a side surface of the concave portion is an inclined surface that is inclined with respect to a thickness direction of the first substrate, and the functional element wire is disposed on the bottom surface, the inclined surface, and the third surface.

2. The vibrator device according to claim 1, wherein the functional element is a thermistor element.

3. An electronic apparatus comprising:

the vibrator device according to claim 1;

an oscillation circuit that oscillates the vibration element;

an A/D converter that converts an analog signal output from the functional element into a digital signal; and a calculation circuit that receives the digital signal.

4. A vehicle comprising:

the vibrator device according to claim 1;

an oscillation circuit that oscillates the vibration element;

an A/D converter that converts an analog signal output from the functional element into a digital signal; and a calculation circuit that receives the digital signal.

5. A vibrator device comprising an intermediate substrate that includes a frame having a first surface and a second surface opposite to the first surface and a vibration element and that is formed of quartz crystal;

a first substrate that is bonded to the first surface of the frame and is formed of quartz crystal or glass;

a second substrate that is bonded to the second surface of the frame and is formed of quartz crystal or glass; and a functional element that is disposed on the first substrate and includes a functional layer, wherein the functional element includes a portion overlapping the vibration element in plan view, the first substrate includes a third surface on the vibration element side, the functional element is disposed on the third surface, the functional element is a thermistor element, a functional element wire is disposed on the third surface and is electrically coupled to the functional element, and the functional element wire is in contact with the frame.

6. The vibrator device according to claim 5, further comprising:

a vibration element wire that is disposed on the third surface and is electrically coupled to the vibration element, wherein each of the functional element wire and the vibration element wire is disposed further inside than a bonding portion of the first substrate and the frame.

7. A vibrator device comprising:

an intermediate substrate that includes a frame having a first surface and a second surface opposite to the first surface and a vibration element and that is formed of quartz crystal;

a first substrate that is bonded to the first surface of the frame and is formed of quartz crystal or glass;

a second substrate that is bonded to the second surface of the frame and is formed of quartz crystal or glass; and a functional element that is disposed on the first substrate and includes a functional layer, wherein the functional element includes a portion overlapping the vibration element in plan view, the first substrate includes a third surface on the vibration element side, a fourth surface opposite to the third surface, and a concave portion opened on the fourth surface, the functional element is disposed on a bottom surface of the concave portion, a functional element wire is electrically coupled to the functional element, a side surface of the concave portion is an inclined surface that is inclined with respect to a thickness direction of the first substrate, and the functional element wire is disposed on the bottom surface, the inclined surface, and the fourth surface.

* * * * *